United States Patent
CP et al.

(10) Patent No.: US 11,557,334 B2
(45) Date of Patent: Jan. 17, 2023

(54) NONVOLATILE MEMORY WITH COMBINED READS

(71) Applicant: SanDisk Technologies LLC, Addison, TX (US)

(72) Inventors: Subin CP, Kozhikode (IN); Gopu S, Kollam (IN); Sainath Viswasarai, Hyderabad (IN)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 17/308,751

(22) Filed: May 5, 2021

(65) Prior Publication Data

US 2022/0358995 A1    Nov. 10, 2022

(51) Int. Cl.
| | |
|---|---|
| G11C 7/22 | (2006.01) |
| G11C 11/4096 | (2006.01) |
| G11C 11/408 | (2006.01) |
| G11C 11/4074 | (2006.01) |
| H03K 19/21 | (2006.01) |
| G11C 7/10 | (2006.01) |

(52) U.S. Cl.
CPC .......... *G11C 11/4096* (2013.01); *G11C 7/106* (2013.01); *G11C 7/1048* (2013.01); *G11C 7/1087* (2013.01); *G11C 11/4074* (2013.01); *G11C 11/4085* (2013.01); *H03K 19/21* (2013.01)

(58) Field of Classification Search
CPC ... G11C 11/4096; G11C 7/1048; G11C 7/106; G11C 7/1087; G11C 11/4074; G11C 11/4085; H03K 19/21
USPC .................................................. 365/189.011
See application file for complete search history.

(56) References Cited

U.S. PATENT DOCUMENTS

| | | |
|---|---|---|
| 7,414,886 B2 | 8/2008 | Li et al. |
| 8,036,034 B2 | 10/2011 | Shiga et al. |
| 8,726,104 B2 | 5/2014 | Sharon |
| 10,043,558 B2 | 8/2018 | Shah et al. |
| 10,121,536 B2 | 11/2018 | Wang et al. |
| 2022/0157387 A1* | 5/2022 | Hara ................. G11C 16/102 |

* cited by examiner

*Primary Examiner* — Huan Hoang
(74) *Attorney, Agent, or Firm* — Vierra Magen Marcus LLP

(57) ABSTRACT

An apparatus includes control circuits configured to connect to a plurality of non-volatile memory cells. Each non-volatile memory cell is configured to store a plurality of bits of a plurality of logical pages including at least a first bit of a first logical page, a second bit of a second logical page and a third bit of a third logical page. The control circuits are configured to select a subset of the plurality of logical pages for reading, perform pre-read steps, and read a first and at least a second selected logical page of the subset without performing pre-read steps between reading the first and second selected logical pages.

20 Claims, 21 Drawing Sheets

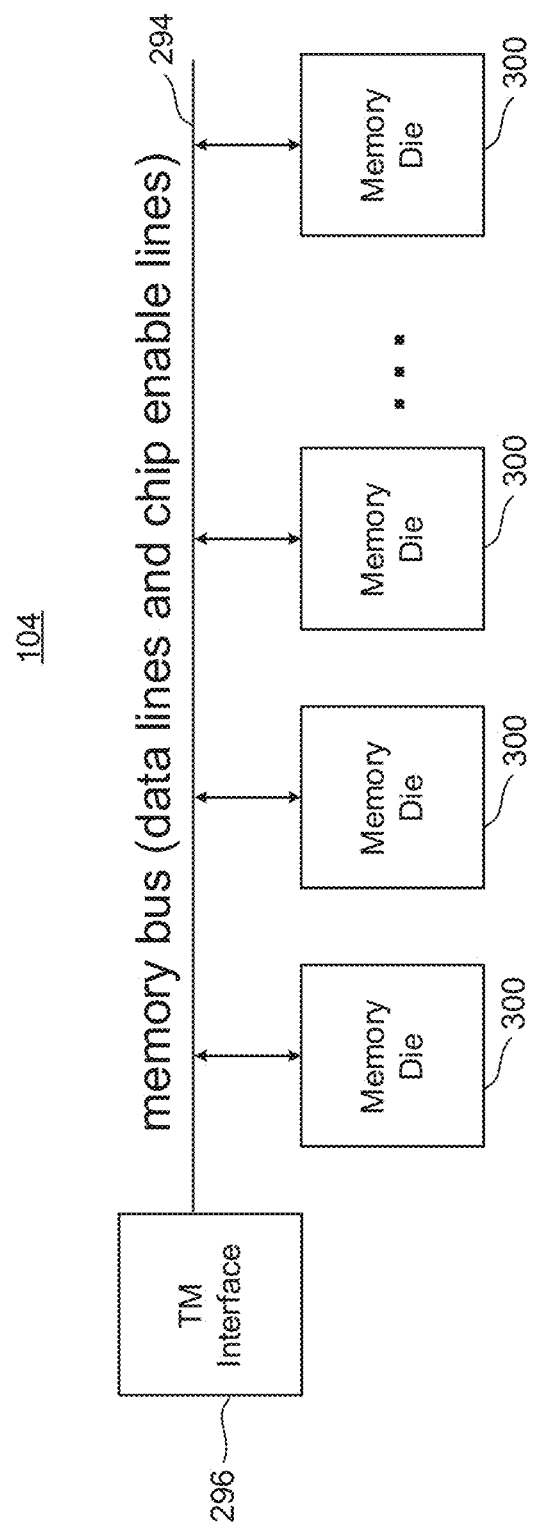

| Page | Er | A | B | C | D | E | F | G | Read level(s) |
|---|---|---|---|---|---|---|---|---|---|
| Lower | 1 | 1 | 1 | 1 | 0 | 0 | 0 | 0 | VrD |
| Middle | 1 | 0 | 0 | 1 | 1 | 1 | 0 | 0 | VrA-VrC-VrF |
| Upper | 1 | 1 | 0 | 0 | 0 | 1 | 1 | 0 | VrB-VrE-VrG |

Figure 13A

|     | Er | A | B | C | D | E | F | G |
|-----|----|----|----|----|----|----|----|----|
| XDL | X | X | X | X | X | X | X | X |
| ADL | X | X | X | X | X | X | X | X |
| BDL | X | X | X | X | X | X | X | X |
| CDL | X | X | X | X | X | X | X | X |
|     | . | . | . | . | . | . | . | . |
|     | . | . | . | . | . | . | . | . |
| SDL | 1 | 1 | 1 | 1 | 1 | 1 | 1 | 1 |
| SEN | 1 | 1 | 1 | 1 | 1 | 1 | 1 | 1 |

Figure 13B

|     | Er | A | B | C | D | E | F | G |
|-----|----|----|----|----|----|----|----|----|
| XDL | X | X | X | X | X | X | X | X |
| ADL | X | X | X | X | X | X | X | X |
| BDL | X | X | X | X | X | X | X | X |
| CDL | X | X | X | X | X | X | X | X |
|     | . | . | . | . | . | . | . | . |
|     | . | . | . | . | . | . | . | . |
| SDL | 1 | 1 | 1 | 1 | 1 | 1 | 1 | 1 |
| SEN | 0 | 0 | 0 | 0 | 1 | 1 | 1 | 1 |

↑ Read voltage VrD

Figure 13C

|     | Er | A | B | C | D | E | F | G |
|-----|----|----|----|----|----|----|----|----|
| XDL | X | X | X | X | X | X | X | X |
| ADL | X | X | X | X | X | X | X | X |
| BDL | X | X | X | X | X | X | X | X |
| CDL | X | X | X | X | X | X | X | X |
|     | . | . | . | . | . | . | . | . |
|     | . | . | . | . | . | . | . | . |
| SDL | 1 | 1 | 1 | 1 | 0 | 0 | 0 | 0 |
| SEN | 0 | 0 | 0 | 0 | 1 | 1 | 1 | 1 |

Figure 13D

|     | Er | A | B | C | D | E | F | G |
|-----|----|----|----|----|----|----|----|----|
| XDL | 1 | 1 | 1 | 1 | 0 | 0 | 0 | 0 |
| ADL | X | X | X | X | X | X | X | X |
| BDL | X | X | X | X | X | X | X | X |
| CDL | X | X | X | X | X | X | X | X |
|     | . | . | . | . | . | . | . | . |
|     | . | . | . | . | . | . | . | . |
| SDL | 1 | 1 | 1 | 1 | 1 | 1 | 1 | 1 |
| SEN | 1 | 1 | 1 | 1 | 1 | 1 | 1 | 1 |

Figure 13E

|     | Er | A | B | C | D | E | F | G |
|-----|----|----|----|----|----|----|----|----|
| XDL | 1 | 1 | 1 | 1 | 0 | 0 | 0 | 0 |
| ADL | X | X | X | X | X | X | X | X |
| BDL | X | X | X | X | X | X | X | X |
| CDL | X | X | X | X | X | X | X | X |
|     | . | . | . | . | . | . | . | . |
|     | . | . | . | . | . | . | . | . |
| SDL | 1 | 1 | 1 | 1 | 1 | 1 | 1 | 1 |
| SEN | 0 | 1 | 1 | 1 | 1 | 1 | 1 | 1 |

↑ Read voltage VrA

Figure 13F

|     | Er | A | B | C | D | E | F | G |
|-----|----|----|----|----|----|----|----|----|
| XDL | 1 | 1 | 1 | 1 | 0 | 0 | 0 | 0 |
| ADL | X | X | X | X | X | X | X | X |
| BDL | X | X | X | X | X | X | X | X |
| CDL | X | X | X | X | X | X | X | X |
|     | . | . | . | . | . | . | . | . |
|     | . | . | . | . | . | . | . | . |
| SDL | 1 | 0 | 0 | 0 | 0 | 0 | 0 | 0 |
| SEN | 0 | 1 | 1 | 1 | 1 | 1 | 1 | 1 |

Figure 13G

|     | Er | A | B | C | D | E | F | G |
|-----|----|----|----|----|----|----|----|----|
| XDL | 1 | 1 | 1 | 1 | 0 | 0 | 0 | 0 |
| ADL | X | X | X | X | X | X | X | X |
| BDL | X | X | X | X | X | X | X | X |
| CDL | X | X | X | X | X | X | X | X |
|     | . | . | . | . | . | . | . | . |
| SDL | 1 | 0 | 0 | 0 | 0 | 0 | 0 | 0 |
| SEN | 1 | 1 | 1 | 1 | 1 | 1 | 1 | 1 |

Figure 13J

|     | Er | A | B | C | D | E | F | G |
|-----|----|----|----|----|----|----|----|----|
| XDL | 1 | 1 | 1 | 1 | 0 | 0 | 0 | 0 |
| ADL | X | X | X | X | X | X | X | X |
| BDL | X | X | X | X | X | X | X | X |
| CDL | X | X | X | X | X | X | X | X |
|     | . | . | . | . | . | . | . | . |
| SDL | 1 | 0 | 0 | 1 | 1 | 1 | 1 | 1 |
| SEN | 0 | 0 | 0 | 0 | 0 | 0 | 1 | 1 |

Read voltage VrF

Figure 13H

|     | Er | A | B | C | D | E | F | G |
|-----|----|----|----|----|----|----|----|----|
| XDL | 1 | 1 | 1 | 1 | 0 | 0 | 0 | 0 |
| ADL | X | X | X | X | X | X | X | X |
| BDL | X | X | X | X | X | X | X | X |
| CDL | X | X | X | X | X | X | X | X |
|     | . | . | . | . | . | . | . | . |
| SDL | 1 | 0 | 0 | 0 | 0 | 0 | 0 | 0 |
| SEN | 0 | 0 | 0 | 1 | 1 | 1 | 1 | 1 |

Read voltage VrC

Figure 13K

|     | Er | A | B | C | D | E | F | G |
|-----|----|----|----|----|----|----|----|----|
| XDL | 1 | 1 | 1 | 1 | 0 | 0 | 0 | 0 |
| ADL | X | X | X | X | X | X | X | X |
| BDL | X | X | X | X | X | X | X | X |
| CDL | X | X | X | X | X | X | X | X |
|     | . | . | . | . | . | . | . | . |
| SDL | 1 | 0 | 0 | 1 | 1 | 1 | 0 | 0 |
| SEN | 0 | 0 | 0 | 0 | 0 | 0 | 1 | 1 |

Figure 13I

|     | Er | A | B | C | D | E | F | G |
|-----|----|----|----|----|----|----|----|----|
| XDL | 1 | 1 | 1 | 1 | 0 | 0 | 0 | 0 |
| ADL | X | X | X | X | X | X | X | X |
| BDL | X | X | X | X | X | X | X | X |
| CDL | X | X | X | X | X | X | X | X |
|     | . | . | . | . | . | . | . | . |
| SDL | 1 | 0 | 0 | 1 | 1 | 1 | 1 | 1 |
| SEN | 1 | 1 | 1 | 1 | 1 | 1 | 1 | 1 |

Figure 13L

|     | Er | A | B | C | D | E | F | G |
|-----|----|----|----|----|----|----|----|----|
| XDL | 1 | 0 | 0 | 1 | 1 | 1 | 0 | 0 |
| ADL | X | X | X | X | X | X | X | X |
| BDL | X | X | X | X | X | X | X | X |
| CDL | X | X | X | X | X | X | X | X |
|     | . | . | . | . | . | . | . | . |
| SDL | 1 | 0 | 0 | 1 | 1 | 1 | 0 | 0 |
| SEN | 0 | 0 | 0 | 0 | 0 | 0 | 1 | 1 | ns
NONVOLATILE MEMORY WITH COMBINED READS

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. Some memory cells store information by storing a charge in a charge storage region. Other memory cells store information using other techniques, such as by the resistance of the memory cell. Some memories store one bit per cell using two data states (Single Level Cell or SLC) while others store more than one bit per cell using more than two data states (Multi Level Cell or MLC).

When a memory system is deployed in or connected to an electronic device (the host), the memory system can be used to store data and read data. It is generally desirable that reading is performed accurately and rapidly and this may be challenging in some memories, for example, in MLC memories.

BRIEF DESCRIPTION OF THE DRAWINGS

Like-numbered elements refer to common components in the different Figures.

In some embodiments, the Front-End Processor Circuit is part of a Controller.

Figure 1A:
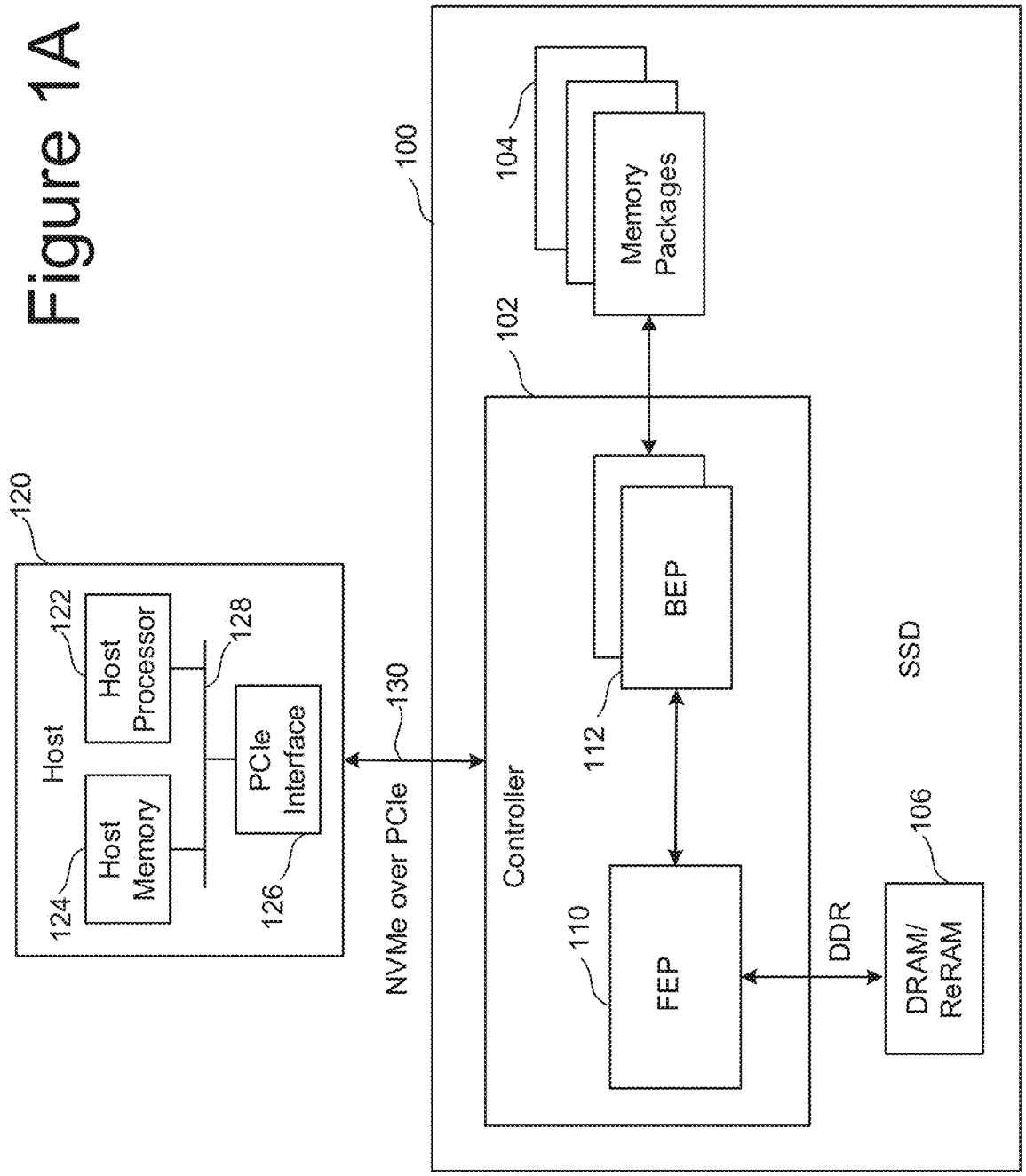
FIG. 1A is a block diagram of one embodiment of a memory system connected to a host.
Figure 1B:
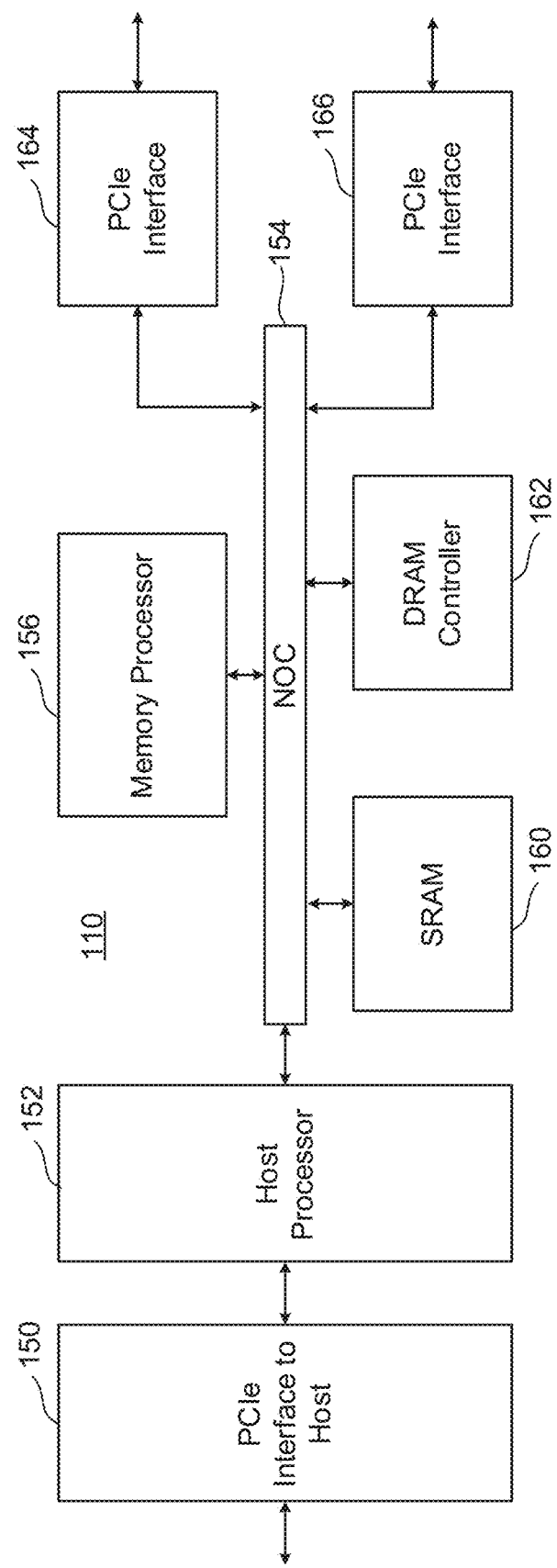
FIG. 1B is a block diagram of one embodiment of a Front-End Processor Circuit.
Figure 1C:
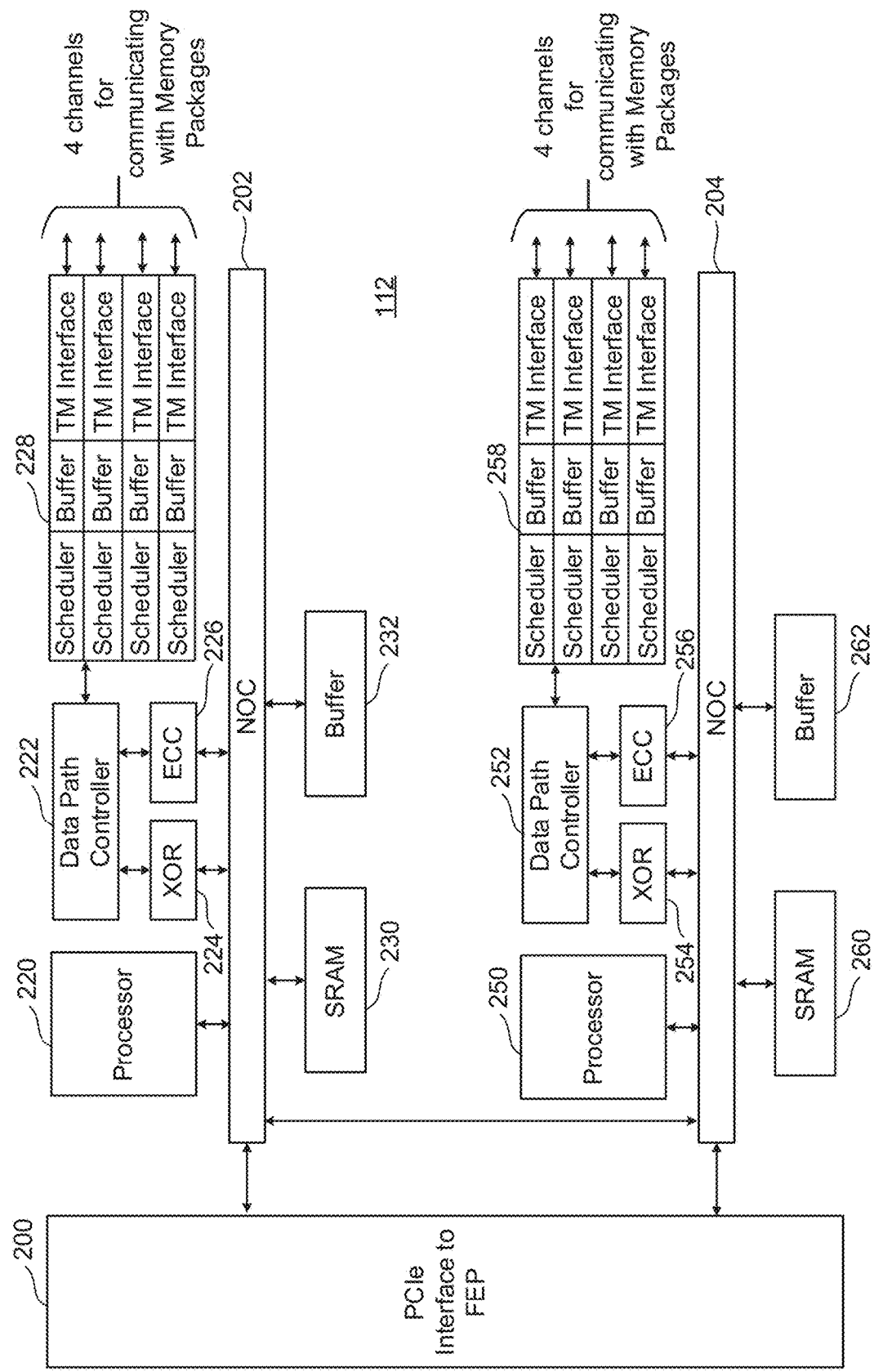

FIG. 1C is a block diagram of one embodiment of a Back End Processor Circuit.

In some embodiments, the Back End Processor Circuit is part of a Controller.

FIG. 1D is a block diagram of one embodiment of a memory package.

Figure 2:
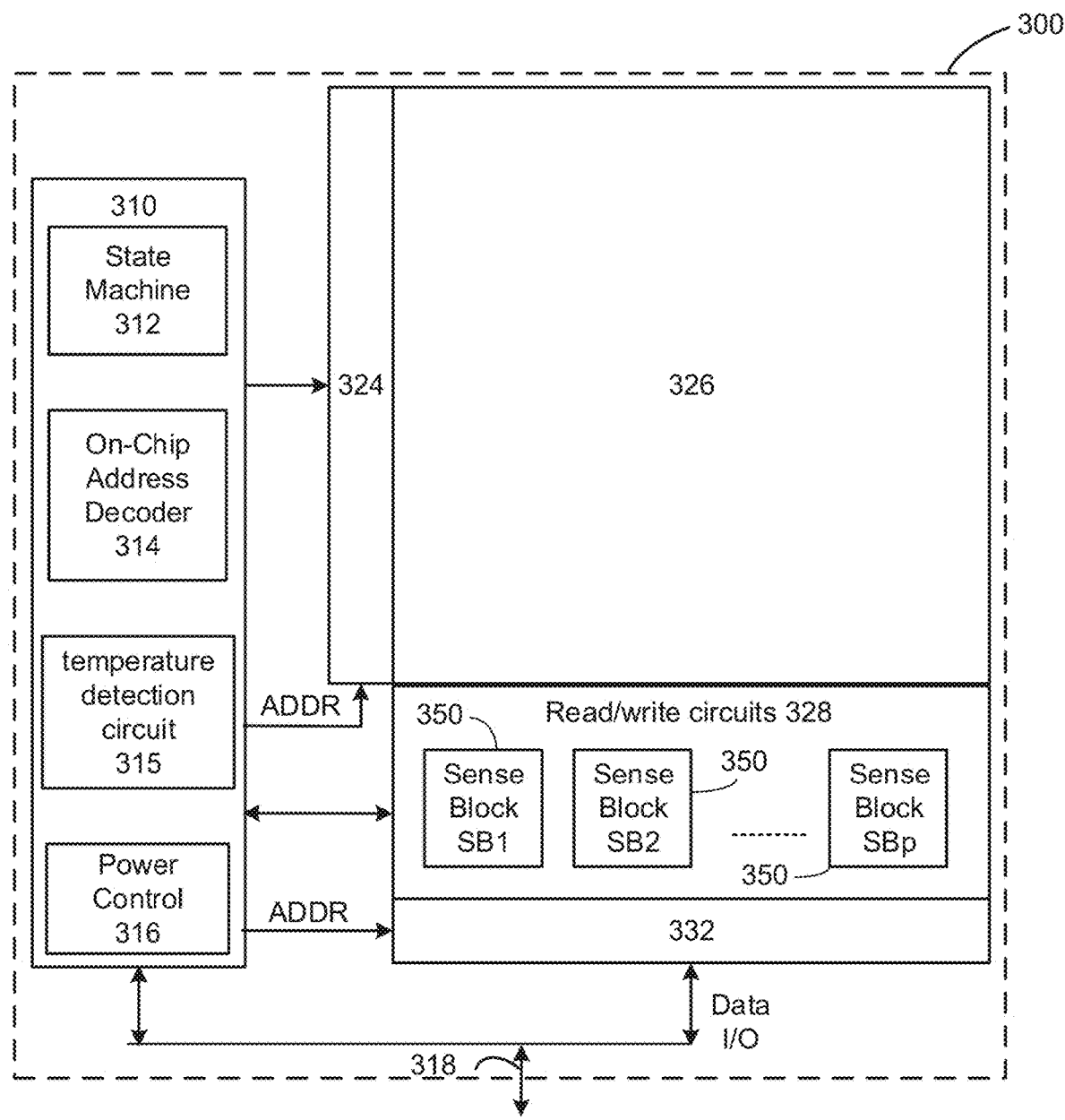

FIG. 2 is a block diagram of one embodiment of a memory die.

Figure 3:
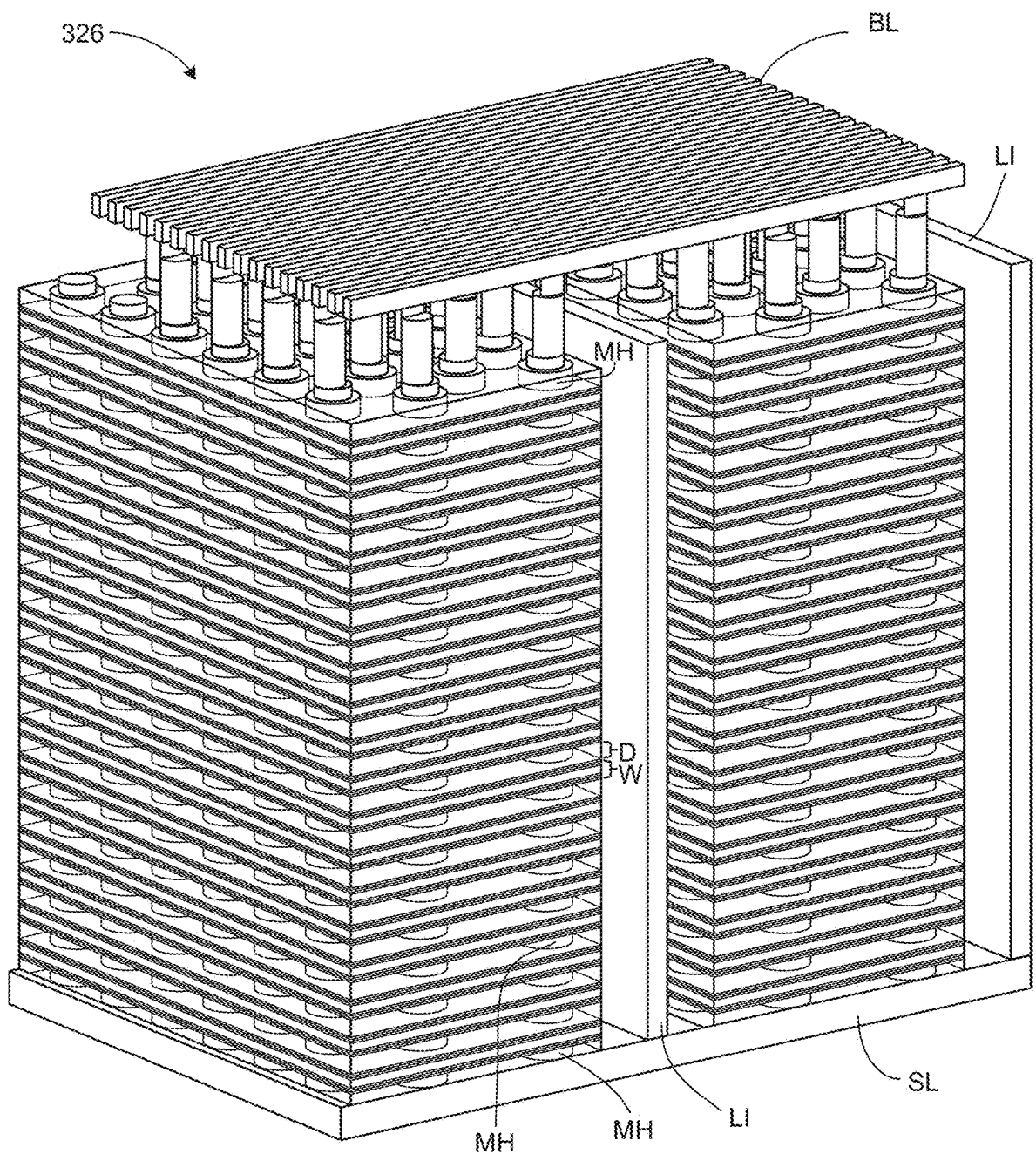

FIG. 3 is a perspective view of a portion of one embodiment of a monolithic three-dimensional memory structure.

Figure 4A:
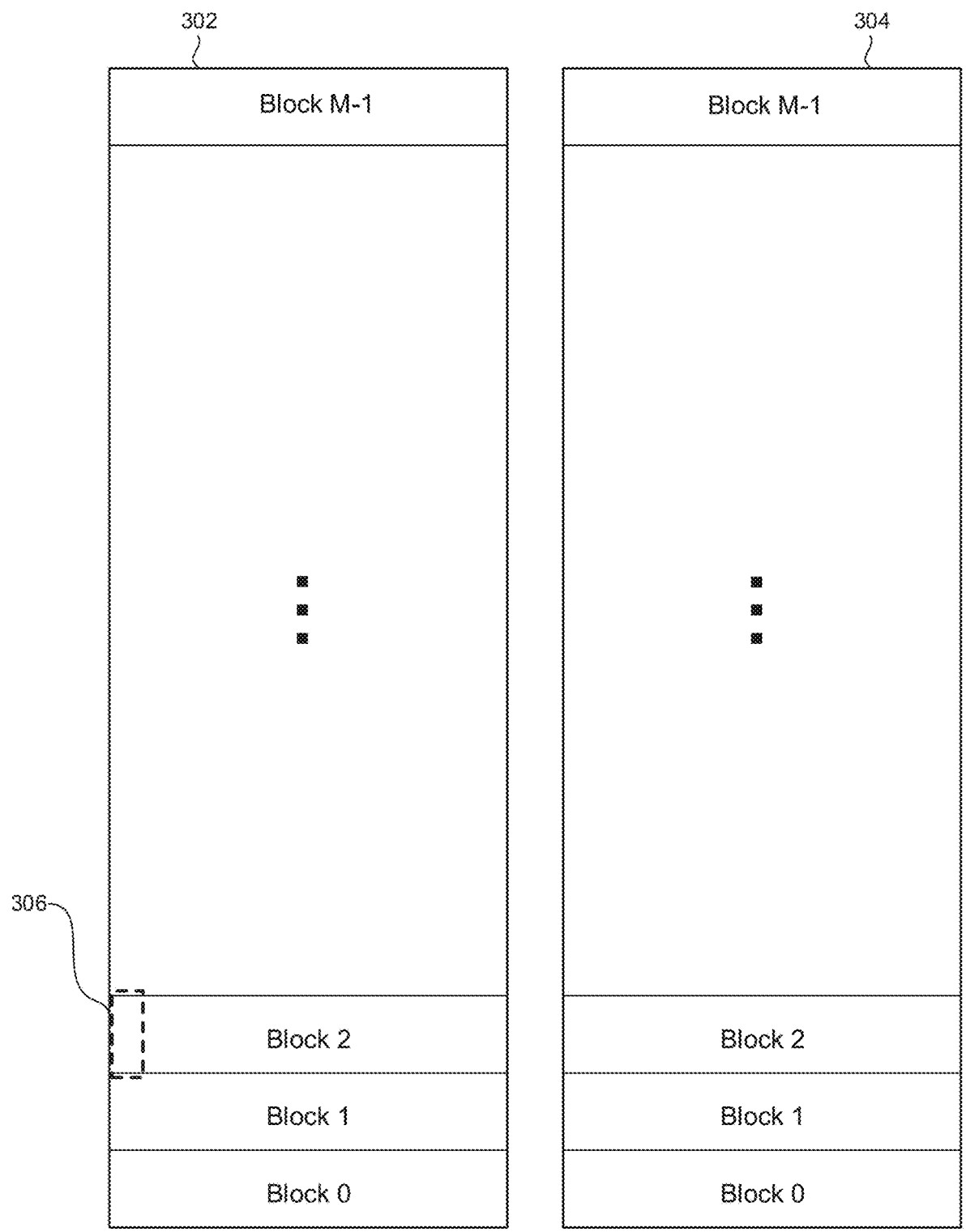

FIG. 4A is a block diagram of a memory structure having two planes.

Figure 4B:
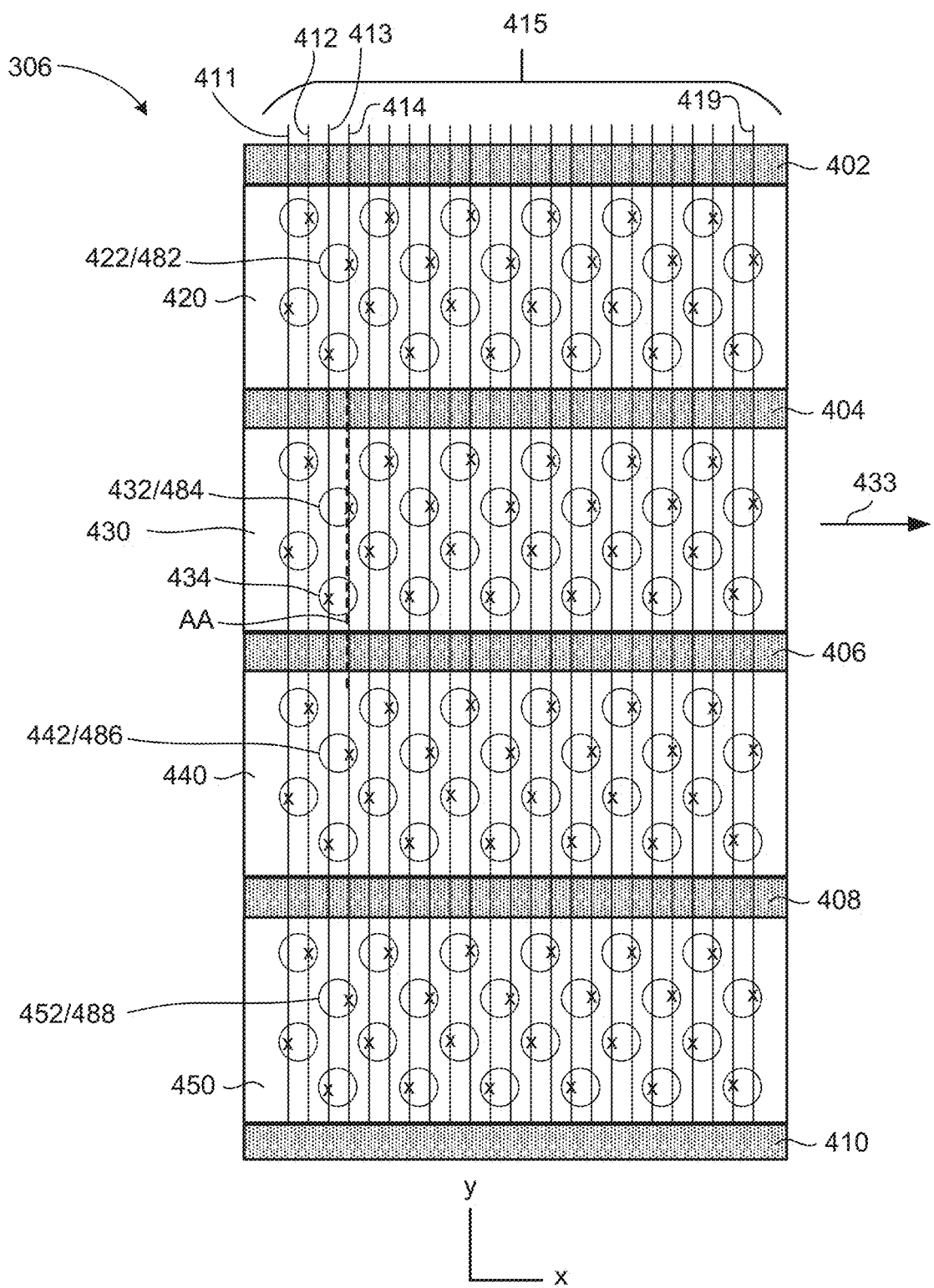

FIG. 4B depicts a top view of a portion of a block of memory cells.

Figure 4C:
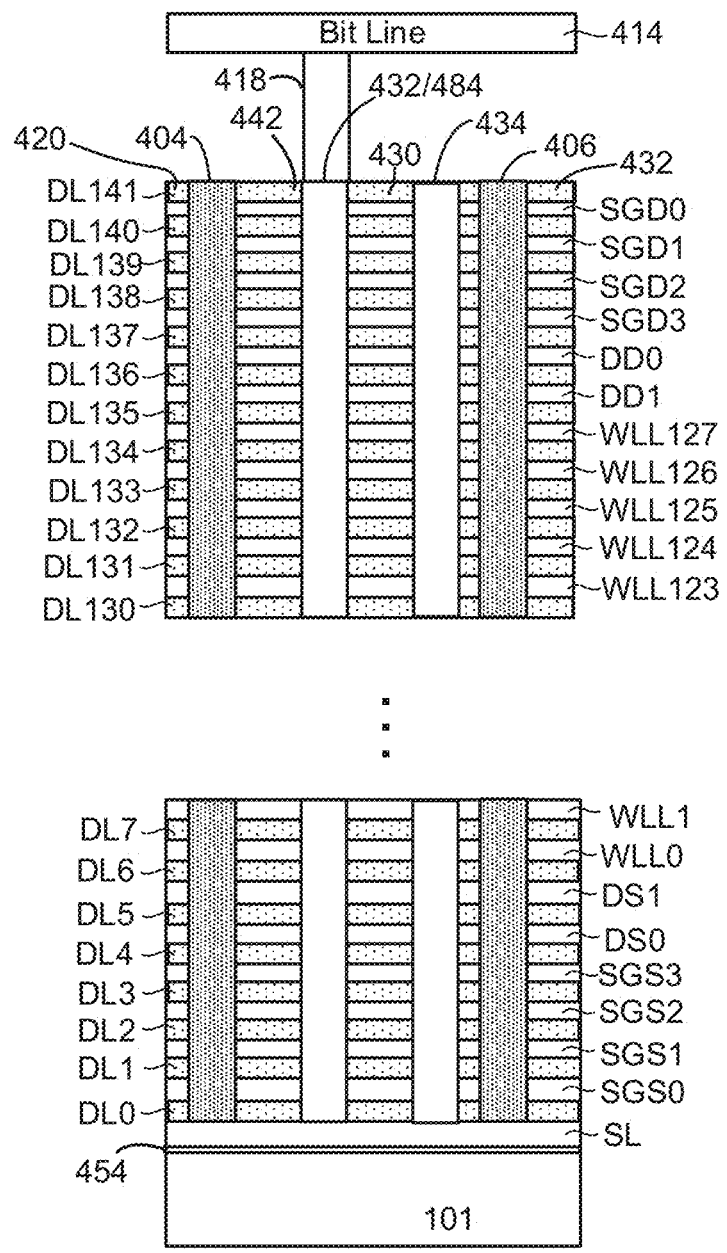

FIG. 4C depicts a cross sectional view of a portion of a block of memory cells.

Figure 5:
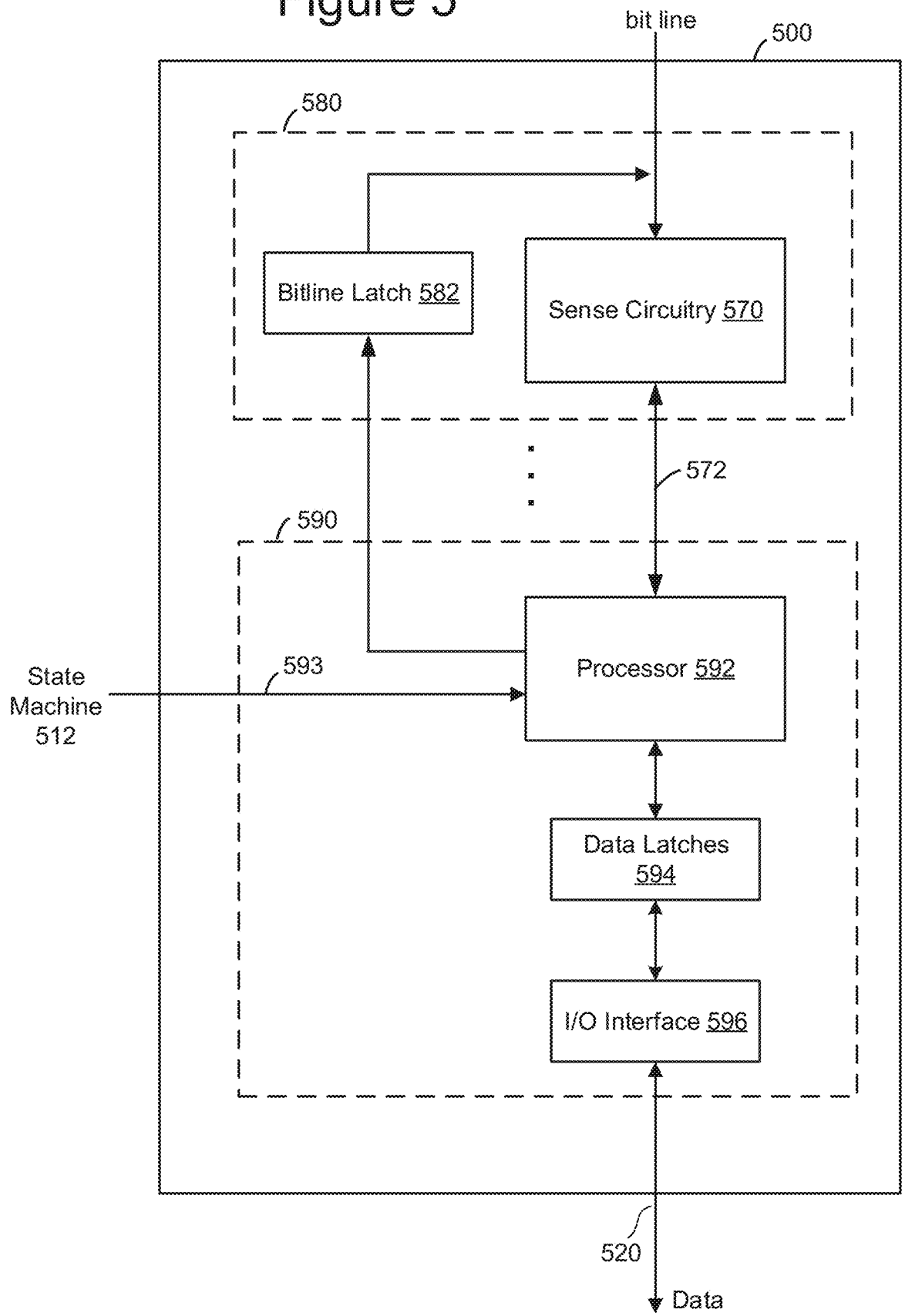

FIG. 5 shows an example of a sense block.

Figures 6A, 6B:
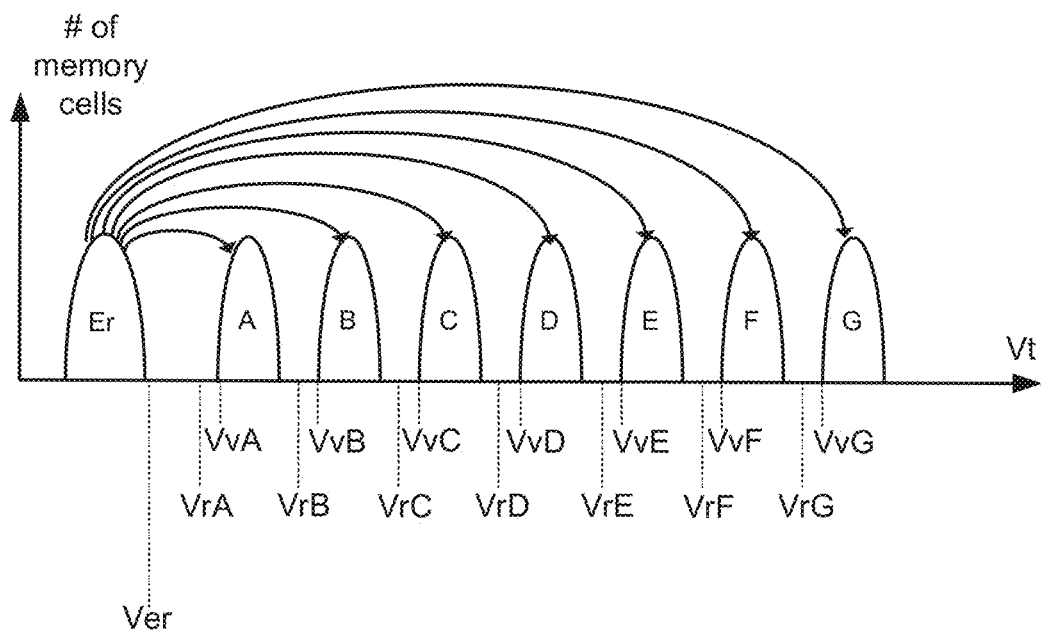

FIG. 6A shows multiple data states of nonvolatile memory cells.

FIG. 6B shows an encoding scheme for data stored in nonvolatile memory cells.

Figure 7A:
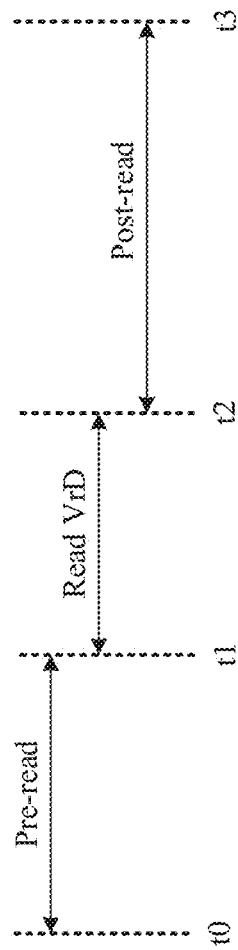
Figure 7B:
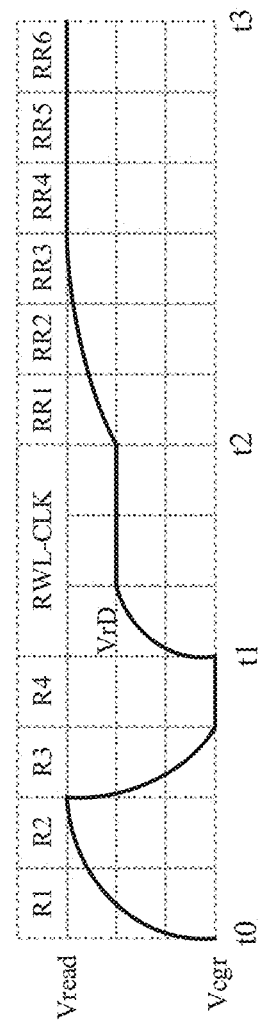

FIGS. 7A-B illustrate a read operation directed to a lower logical page.

Figure 8A:
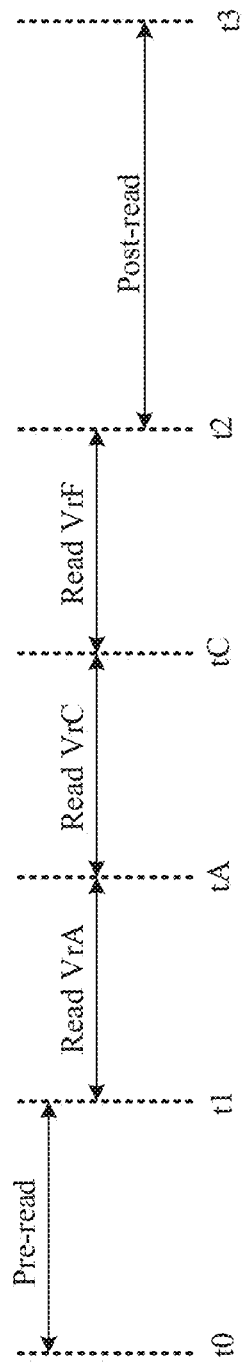
Figure 8B:
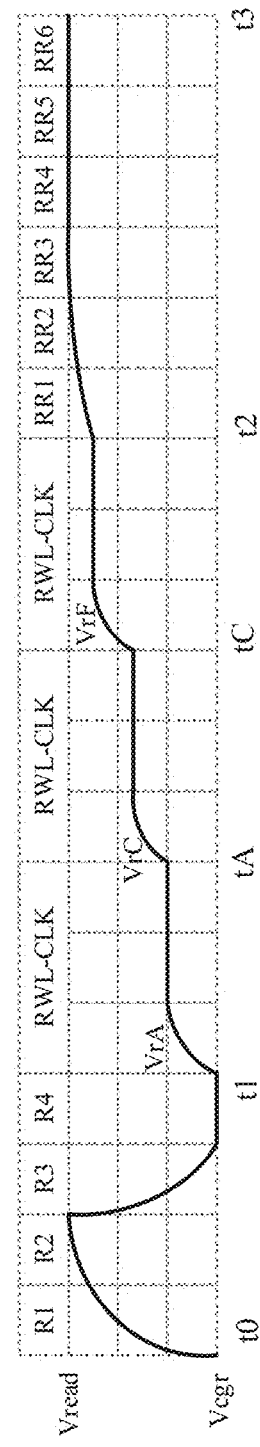

FIGS. 8A-B illustrate a read operation directed to a middle logical page.

Figure 9A:
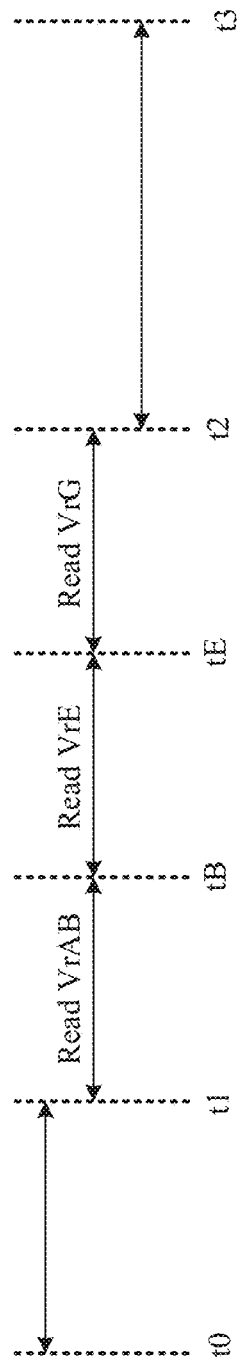
Figure 9B:
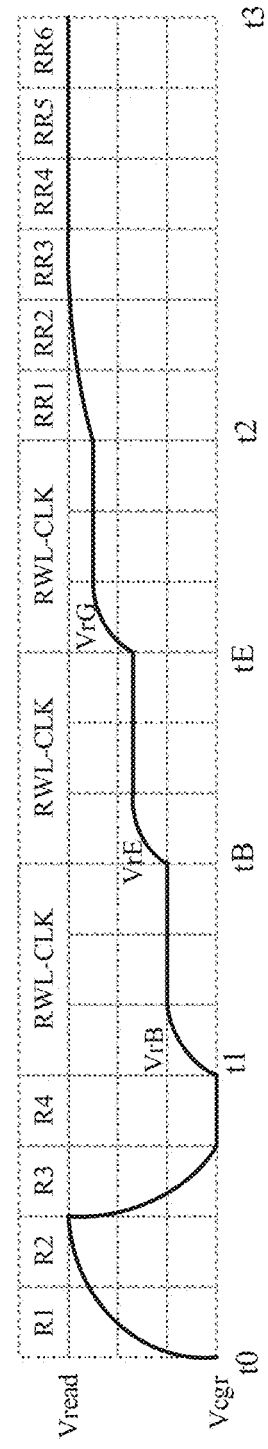

FIGS. 9A-B illustrate a read operation directed to an upper logical page.

Figure 10:
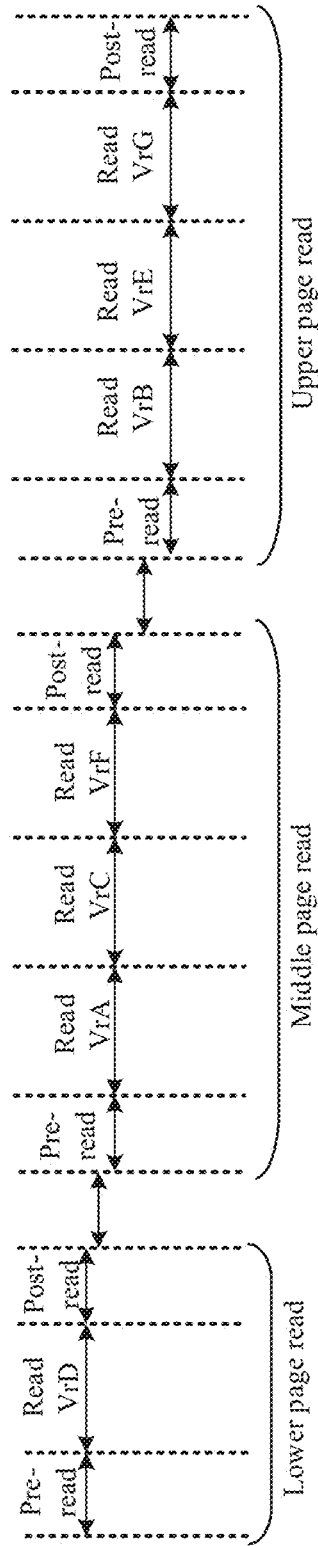

FIG. 10 illustrates individual random read operations directed to the lower, middle, and upper logical pages.

Figure 11:
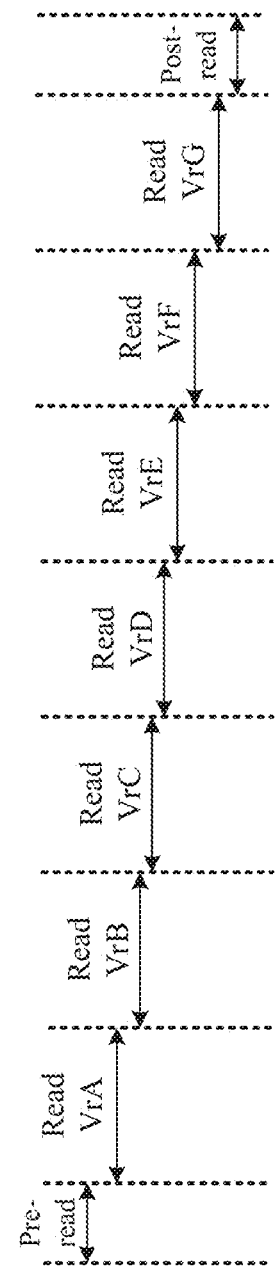

FIG. 11 illustrates a sequential read of all logical pages that are stored together.

Figure 12A:
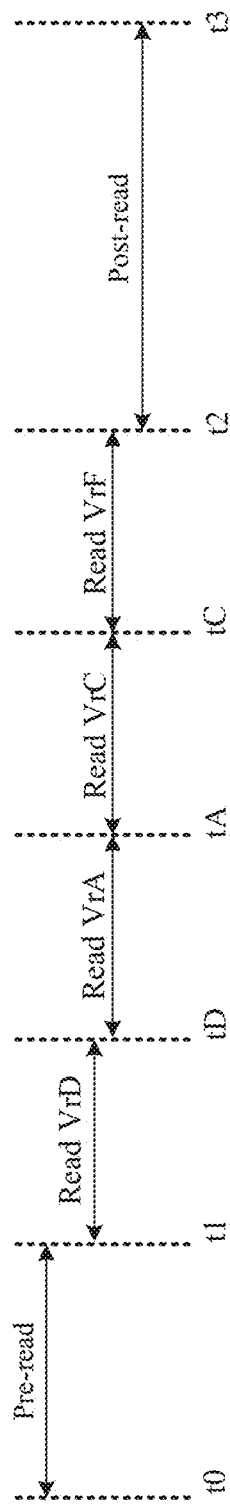
Figure 12B:
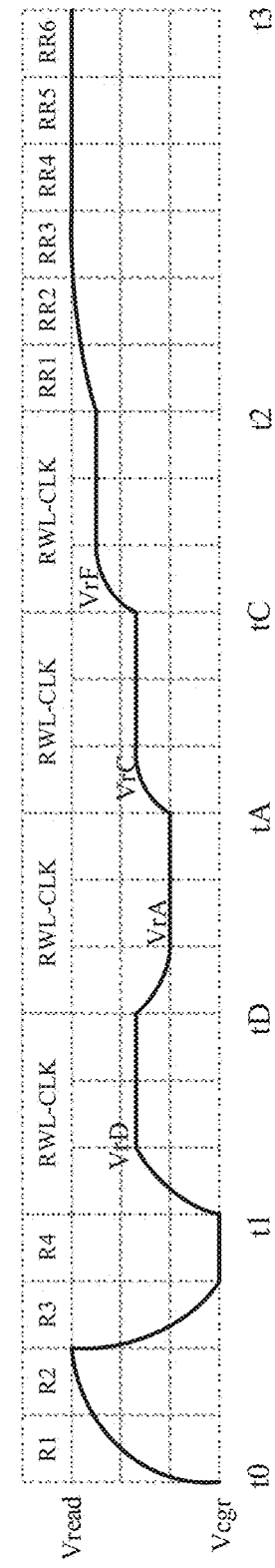

FIGS. 12A-B illustrate an example of a combined read of lower and middle pages.

FIGS. 13A-L illustrate an example implementation of a combined read of lower and middle pages.

Figure 14A:
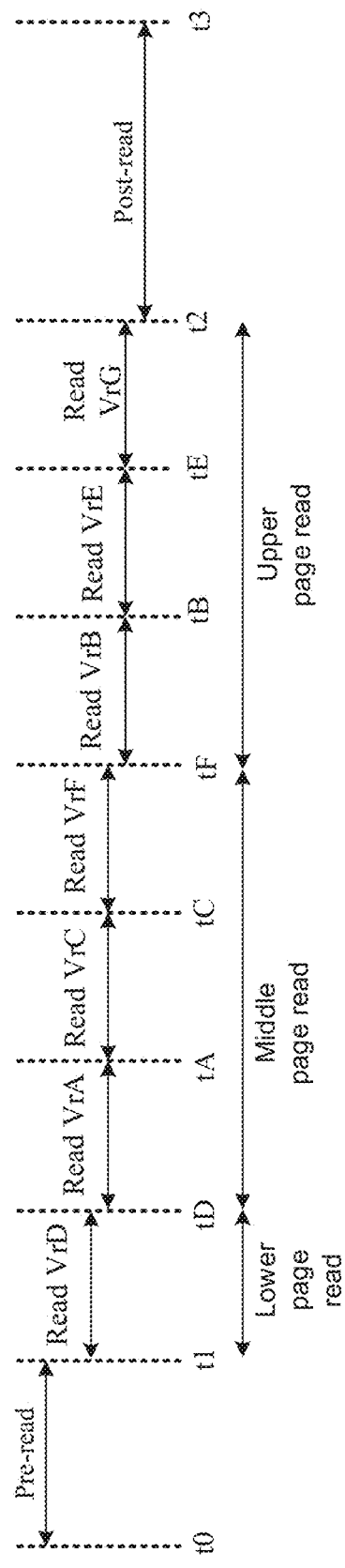
Figure 14B:
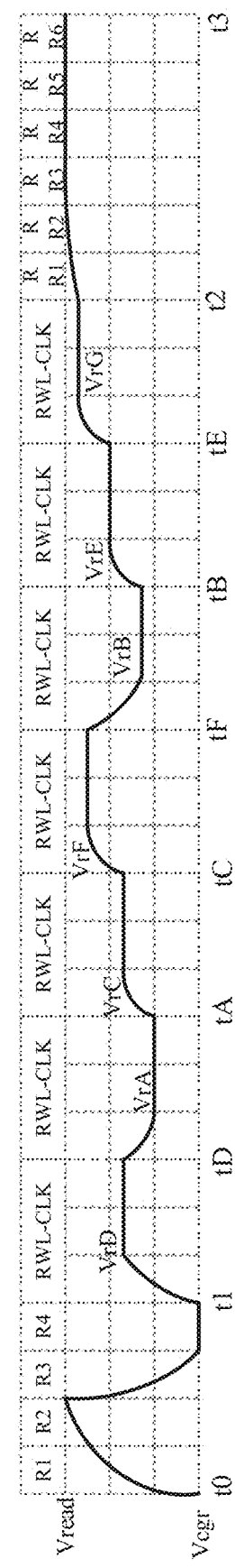

FIGS. 14A-B illustrate an example of a combined read of lower, middle, and upper logical pages.

Figure 15:
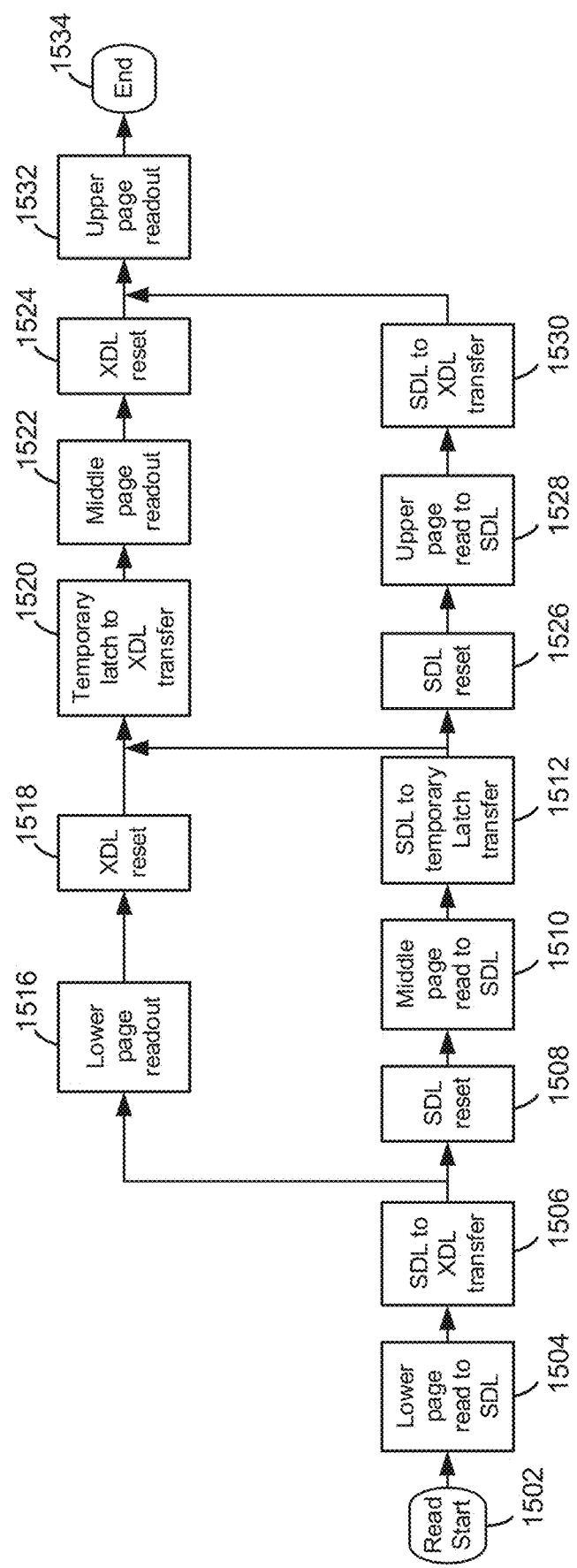

FIG. 15 illustrates an example implementation of a combined read of lower, middle, and upper logical pages.

Figure 16:
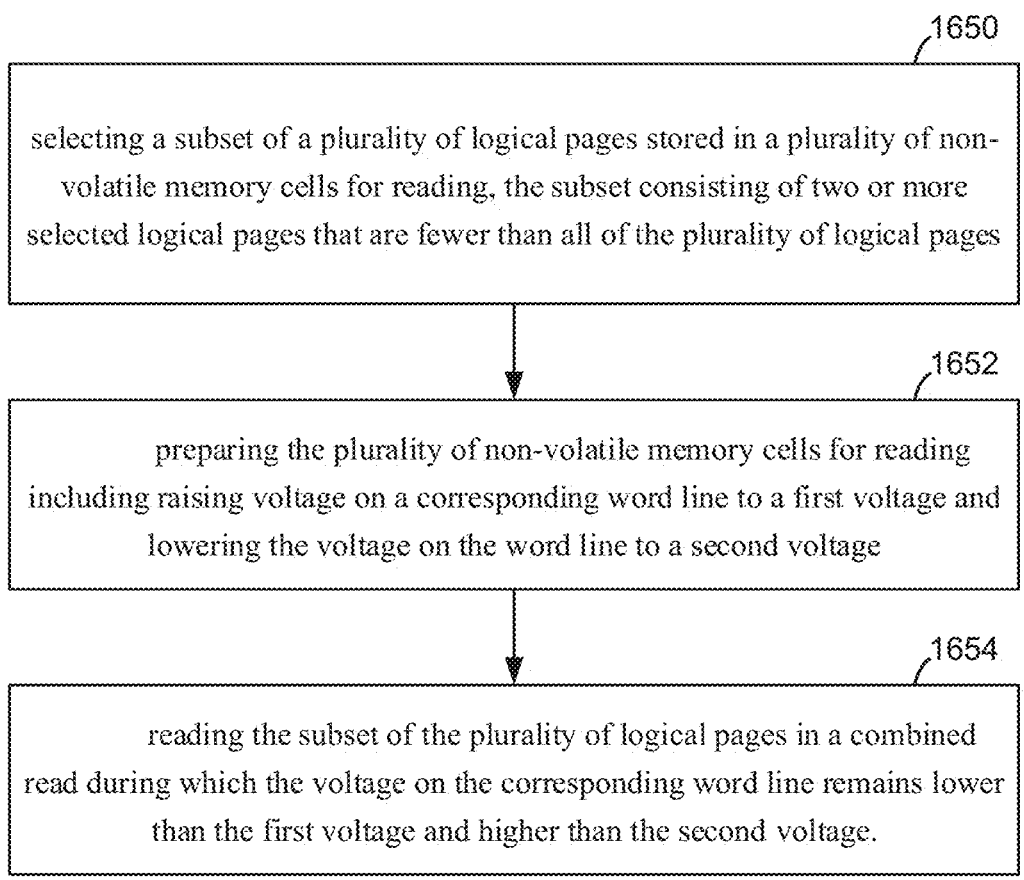

FIG. 16 illustrates a method that includes a combined read.

DETAILED DESCRIPTION

Techniques are disclosed herein to enable efficient reading of data from non-volatile memory. In some memory structures, non-volatile memory cells are each configured to store a plurality of bits. A group of such non-volatile memory cells may store multiple logical pages of data where a logical page is a unit of reading. For example, each non-volatile memory cell may be configured to store at least a first bit of a first logical page, a second bit of a second logical page and a third bit of a third logical page. Accessing logical pages individually by random reads specifying the specific logical page may be inefficient when more than one logical page is required from a group of non-volatile memory cells. Accessing all pages together in a sequential read may also be inefficient where fewer than all logical pages are required from a group of non-volatile memory cells.

Aspects of the present technology provide solutions to the technical problem of efficiently reading data from non-volatile memory cells (e.g., Multi-Level Cell (MLC) flash memory cells in a NAND arrangement). A combined read may be used to combine reading of two or more logical pages. Pre-read and post-read steps are performed once for all logical pages of such a combined read (not for each logical page read), which may save time compared with individual random reads. Only selected logical pages are read (not any unselected logical page in the same non-volatile memory cells), which may save time compared with a sequential read.

Logical pages may be read and transferred in parallel in a combined read so that data of a first logical page may be transferred (e.g., to a memory controller) while a second logical page is being read. Multiple latches may be provided to allow multiple pages of data to be read, stored, and transferred at the same time.

FIG. 1A is a block diagram of one embodiment of a memory system 100 connected to a host 120. Memory system 100 can implement the technology proposed herein. Many different types of memory systems can be used with the technology proposed herein. One example memory system is a solid-state drive ("SSD"); however, other types of memory systems can also be used. Memory system 100 comprises a Controller 102, non-volatile memory 104 for storing data, and local memory (e.g., DRAM/ReRAM) 106. Controller 102 comprises a Front-End Processor Circuit (FEP) 110 and one or more Back End Processor Circuits (BEP) 112. In one embodiment FEP circuit 110 is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP circuit 110 and BEP 112 work as a master slave configuration where the FEP circuit 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 14 utilize NAND flash memory (including two-dimensional NAND flash memory and/or three-dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected to bus 128. Host memory 124 is the host's physical memory, and can be DRAM, SRAM, non-volatile memory or another type of storage. Host 120 is external to and separate from memory system 100. In one embodiment, memory system 100 is embedded in host 120.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

FIG. 1D is a block diagram of one embodiment of a memory package 104 that includes a plurality of memory die 300 connected to a memory bus 294 (data lines and chip enable lines). The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

FIG. 2 is a functional block diagram of one embodiment of a memory die 300. Each of the one or more memory die 300 of FIG. 1D can be implemented as memory die 300 of FIG. 2. The components depicted in FIG. 2 are electrical circuits. In one embodiment, each memory die 300 includes a memory structure 326, control circuits 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuits) and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers.

Commands and data are transferred between the controller and the memory die 300 via lines 318, which may form a bus between memory die 300 and the controller (e.g., memory bus 294). In one embodiment, memory die 300 includes a set of input and/or output (I/O) pins that connect to lines 318.

Control circuits 310 cooperate with the read/write circuits 328 to perform memory operations (e.g., write, read, erase, and others) on memory structure 326. In one embodiment, control circuits 310 includes a state machine 312, an on-chip address decoder 314, a power control module 316 (power control circuit) and a temperature detection circuit 315. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuits 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuits 310, alone or in combination with read/write circuits 328 and decoders 324/332, comprise one or more control circuits for memory structure 326. These one or more control circuits are electrical circuits that perform the functions described below in the flow charts and signal diagrams. In other embodiments, the one or more control circuits can consist only of controller 102, which is an electrical circuit in combination with software, that performs the functions described below in the flow charts and signal diagrams. In another alternative, the one or more control circuits comprise controller 102 and control circuits 310 performing the functions described below in the flow charts and signal diagrams. In another embodiment, the one or more control circuits comprise state machine 312 (or a microcontroller or microprocessor) alone or in combination with controller 102.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

In one embodiment, the control circuit(s) (e.g., control circuits 310) are formed on a first die, referred to as a control die, and the memory array (e.g., memory structure 326) is formed on a second die, referred to as a memory die. For example, some or all control circuits (e.g., control circuit 310, row decoder 324, column decoder 332, and read/write circuits 328) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g., one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

FIG. 3 is a perspective view of a portion of one example embodiment of a monolithic three-dimensional memory array that can comprise memory structure 326, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-278 alternating dielectric layers and conductive layers, for example, 127 data word line layers, 8 select layers, 4 dummy word line layers and 139 dielectric layers.

More or fewer than 108-278 layers can also be used. As will be explained below, the alternating dielectric layers and conductive layers are divided into four "fingers" by local interconnects LI. FIG. 3 shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory array that comprises memory structure 326 is provided below with respect to FIG. 4A-4C.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In some embodiments, a block represents a groups of connected memory cells as the memory cells of a block share a common set of word lines.

FIGS. 4B-4C depict an example three dimensional ("3D") NAND structure. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 433. In one embodiment, the memory array has sixty layers. Other embodiments have less than or more than sixty layers. However, FIG. 4B only shows the top layer.

FIG. 4B depicts a plurality of circles that represent the vertical columns. Each of the vertical columns include multiple select gates (also referred to as a select transistors) and multiple memory cells (also referred to as data memory cells). In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 433, the block includes more vertical columns than depicted in FIG. 4B FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines may be connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

FIG. 4C depicts a portion of one embodiment of a three-dimensional memory structure 326 showing a cross-sectional view along line AA of FIG. 4B. This cross-sectional view cuts through vertical columns 432 and 434 and region 430 (see FIG. 4B). The structure of FIG. 4C includes four drain side select layers SGD0, SGD1, SGD2 and SGD3 associated with the drain side select gates; four source side select layers SGS0, SGS1, SGS2 and SGS3 associated with the source side select gates; four dummy word line layers DD0, DD1, DS0 and DS1; and forty-eight data word line layers WLL0-WLL127 for connecting to data memory cells. Other embodiments can implement more or less than four drain side select layers, more or less than four source side select layers, more or less than four dummy word line layers, and more or less than one hundred and twenty eight word line layers. Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit line 414 via connector 418. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL127 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL141. For example, dielectric layers DL131 is above word line layer WLL123 and below word line layer WLL124. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL127 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Although the example memory system of FIGS. 3-4C is a three-dimensional memory structure that includes vertical NAND strings with charge-trapping material, other (2D and 3D) memory structures can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

FIG. 5 depicts one embodiment of a sense block 500, such as sense block 350 in FIG. 2. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. Processor 592 may also move data between latches and perform operations on data in latches (e.g., performing logic operations such as Exclusive OR (XOR) operations. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latches 594 include a stack of data latches corresponding to the sense module. In one embodiment, there are three or more data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

FIG. 6A illustrates example threshold voltage distributions for the memory array when each memory cell stores three bits of data. Other embodiments, however, may use other data capacities per memory cell (e.g., such as one, two, four, or five bits of data per memory cell). Storing more than one bit of data per memory cell is referred to Multi-Level Cell (MLC). Storing one bit of data per memory cell is referred to a Single-Level Cell (SLC). FIG. 6A shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits.

FIG. 6A shows seven verify reference voltages, VvA, VvB, VvC, VvD, VvE, VvF, and VvG. When programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC, and so on up to state G. FIG. 6A also shows Ver, which is a voltage level to test whether a memory cell has been properly erased.

FIG. 6A also shows seven read reference voltages, VrA, VrB, VrC, VrD, VrE, VrF, and VrG for reading data from memory cells. By testing whether the threshold voltage of a given memory cell is above or below the seven read reference voltages (e.g., performing sense operations using a sense block such as sense block 350), the system can determine what data state (e.g., Er, A, B, C, . . . ) a memory cell is in. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

Although FIG. 6A shows the Vt distributions as non-overlapping, there may be some overlap between adjacent Vt distributions. Over time, effects such as read disturb and data retention may change the shape of the Vt distributions. Read disturb may slightly increase the Vt of a memory cell. Data retention may slightly lower the Vt of a memory cell.

Threshold voltage is one example of a physical property that may be used to store a data state in a memory cell. Resistance is another example of a physical property that may be used to store a data state in a memory cell. In some embodiments, the memory cells are programmed to different resistance states instead of different Vt distributions. For example, phase change memory cells or ReRAM memory cells may be programmed to different resistance states. The memory system applies read reference voltages to the memory cells to distinguish between adjacent resistance states, in some embodiments. In some embodiments, the system dynamically determines a new read reference voltage for distinguishing between two data states associated with two adjacent resistance distributions.

FIG. 6B illustrates an example of a Gray code encoding scheme that maps specific data values to the data states illustrated in FIG. 6A and indicates read voltages used to read each logical page. Each memory state is associated with a corresponding three-bit value (e.g., the Er state is associated with "1,1,1," the A state is associated with "1,0,1," and so on as shown by respective columns of FIG. 6B). Data is stored as lower, middle, and upper logical pages of data as shown by corresponding rows. A physical page of non-volatile memory cells stores three logical pages of data with each non-volatile memory cell configured to store a plurality of bits (e.g., 3 bits) of a plurality of logical pages (e.g., 3 pages) including at least a first bit of a first (e.g., lower) logical page, a second bit of a second (e.g., middle) logical page and a third bit of a third (e.g., upper) logical page. A physical page of such non-volatile memory cells (e.g., x non-volatile memory cells) may store three logical pages with each logical page having x-bits for a total of 3x bits in the physical page.

In an example of a read scheme, each logical page may be individually read without reading all logical pages stored together in a physical page (random read). For example, a memory controller (e.g., controller 102) may send an individual read command to non-volatile memory (e.g., to non-volatile memory 104) to read a lower page. In response, the non-volatile memory may initiate reading (e.g., by a sense block) using read level VrD to identify memory cells having threshold voltages above VrD, and thus determine which cells store a bit value 0 in the lower logical page (with remaining memory cells having bit value 1 in the lower page) as shown in the lower page row of FIG. 6B. This may be done without reading middle or upper logical pages and thus without reading at corresponding read levels VrA, VrB, VrC, VrE, VrF, VrG. Reading a middle or lower logical page requires sensing at three different voltage levels. For example, to read the middle logical page, the non-volatile memory may initiate reading (e.g., by a sense block) using read levels VrA, VrC, and VrF to identify memory cells having threshold voltages between VrA and VrC and those having threshold voltages above VrF, and thus determine which cells store a bit value 0 in the middle page (with remaining memory cells having a bit value 1 in the middle page) as shown in the middle page row of FIG. 6B. To read the upper logical page, the non-volatile memory may initiate reading (e.g., by a sense block) using read levels VrB, VrE, and VrG to identify memory cells having threshold voltages between VrB and VrE and those having threshold voltages above VrG, and thus determine which cells store a bit value 0 in the upper page (with remaining memory cells having a bit value 1 in the lower page) as shown in the upper page row of FIG. 6B. Such a scheme that includes reading at one level for the lower logical page and three levels for the middle and upper logical pages may be referred to as a "133 coding" scheme. Other coding schemes (with or without Gray coding) are possible, and the present technology is not limited to any particular coding schemes.

FIG. 7A is an example of a timing diagram for a read operation directed to a lower logical page. FIG. 7A shows a read operation that extends over three periods including a first period (pre-read period) from time t0 to t1, second period (read period) from time t1 to t2, and a third period (post-read period) from time t2 to t3.

During the pre-read period from time t0 to t1, the non-volatile memory may be prepared for reading the selected logical word, e.g., by bringing voltages of various memory components such as word lines (both selected and unselected), bit lines, and select lines, to appropriate voltages for reading. For example, unselected word lines may be increased to read-pass voltage(s) to allow current flow through unselected cells, selected word lines may undergo some voltage cycle (e.g., see FIG. 7B) to discharge any preexisting charge, bit line voltages may be increased to target bit line voltage(s) in preparation for reading, select line voltages may be increased to select gate voltages (to turn on select gates). Various pre-read steps may be performed to ensure an accurate read including charging/discharging components to ensure that such components do not retain some charge from previous operations (e.g., from a previous read or from a write) that might affect reading.

Subsequently, during the read period from time t1 to t2, the non-volatile memory performs reading of the selected memory cells at the desired read voltage(s) to obtain the stored data. In this example, a lower logical page read requires only a single read voltage (VrD) to obtain the data of the lower logical page.

Subsequently, during the post-read period from t2 to t3, the non-volatile memory may perform various post-read steps to return the memory to a condition in which it is ready to perform a subsequent operation (e.g., a subsequent read operation, or a write operation, in response to a corresponding command from a controller). For example, bit lines, select lines, and unselected word lines may be discharged. Selected word line voltage may increase to Vread as shown.

FIG. 7B illustrates an example of a read operation in more detail including voltage on a selected word line throughout the read operation (word line voltage is shown on the vertical axis with time along the horizontal axis). During the pre-read period, voltage on the selected word line is raised to a first voltage Vread, and is then lowered to a second (lower) voltage, Vcgr, and allowed to stabilize at Vcgr. Four clock periods, R1, R2, R3, and R4 are shown with word line voltage increased over R1-R2, decreased over R3, and stabilized over R4. Also during this time, voltages on unselected word lines may be brought to appropriate read-pass voltages to allow current to flow through unselected memory cells (e.g., to a voltage higher than the read voltages to be used such as Vread). Voltages on select lines of the selected NAND strings may be brought to appropriate voltages to turn on corresponding select transistors. Voltages on bit lines connected to the selected memory cells may be brought to appropriate voltages for reading (e.g., bit lines may be charged up to a voltage to allow current flow through NAND strings). Other preparation steps may also be performed during the pre-read period.

During the read period, the voltage on the selected word line is brought from Vcgr to the desired read voltage, VrD, and is maintained at VrD throughout the rest of the read period while the selected non-volatile memory cells are sensed at this voltage (e.g., by sense block 500. A read clock, RWL-CLK, is used to time the read period (e.g., set to a time from 1 to 20 microseconds).

During the post-read period, the voltage on the selected word line is increased from the read voltage, VrD, to Vread. Other post-read steps may also be performed. For example, voltages on bit lines (selected and unselected), select lines, and unselected word lines may be lowered from voltages used for reading to lower voltages (e.g., to ground voltage or some low voltage). Post-read steps may return the non-volatile memory to a condition in which power use is reduced (current flow is low or zero) and it is ready for a subsequent operation.

FIG. 8A is an example of a timing diagram for a read operation directed to a middle logical page. FIG. 8A shows a read operation that extends over three periods including a first period (pre-read period) from time t0 to t1, second period (read period) from time t1 to t2, and a third period (post-read period) from time t2 to t3.

During the pre-read period from time t0 to t1, the non-volatile memory may be prepared for reading the selected logical word, e.g., by bringing voltages of various memory components such as word lines, bit lines, select lines, to appropriate voltages for reading as discussed with respect to the lower logical page read operation of FIGS. 7A-B.

Subsequently, during the read period from time t1 to t2, the non-volatile memory performs reading of the selected memory cells at the desired read voltage(s) to obtain the stored data. In this example, a middle logical page read requires three read steps at three different read voltages to obtain the data of the middle logical page. The first read step from t1 to tA reads the selected memory cells using read voltage VrA, the second read step from tA to tC reads the selected memory cells at read voltage VrC and the third read step from tC to t2 reads the selected memory cells at read voltage VrF.

Subsequently, during the post-read period from t2 to t3, the non-volatile memory may perform various post-read steps to return the memory to a condition in which it is ready to perform a subsequent operation as previously described.

FIG. 8B illustrates an example of a middle page read operation in more detail including voltage on a selected word line throughout the read operation (word line voltage is shown on the vertical axis with time along the horizontal axis). During the pre-read period, voltage on the selected word line is raised to a first voltage Vread and is then lowered to a second (lower) voltage, Vcgr, and allowed to stabilize at Vcgr as discussed with respect to FIG. 7B.

During the read period, the voltage on the selected word line is brought from Vcgr to the first desired read voltage, VrA, and is maintained at VrA throughout a first read step while the selected non-volatile memory cells are sensed at this voltage (e.g., by sense block 500). A read clock, RWL-CLK, is used to time the read step. Subsequently, in a second read step, the voltage on the selected word line is brought directly from VrA to the second desired read voltage, VrC, and is then maintained at VrC throughout a second read step (time indicated by RWL-CLK) while the selected non-volatile memory cells are sensed at this voltage. Subsequently, in a third read step, the voltage on the selected word line is brought directly from VrC to the third desired read voltage, VrF, and is then maintained at VrF throughout the third read step (time indicated by RWL-CLK).

During the post-read period, the voltage on the selected word line is brought from the read voltage, VrF, to Vread. Post-read steps may be similar to those described with respect to FIG. 7B.

FIG. 9A is an example of a timing diagram for a read operation directed to an upper logical page. FIG. 9A shows a read operation that extends over three periods including a first period (pre-read period) from time t0 to t1, second period (read period) from time t1 to t2, and a third period (post-read period) from time t2 to t3.

During the pre-read period from time t0 to t1, the non-volatile memory may be prepared for reading the selected logical word, e.g., by bringing voltages of various memory components such as word lines, bit lines, select lines, to appropriate voltages for reading as discussed with respect to the lower logical page read operation of FIGS. 7A-B.

Subsequently, during the read period from time t1 to t2, the non-volatile memory performs reading of the selected memory cells at the desired read voltage(s) to obtain the stored data. In this example, an upper logical page read requires three read steps at three different read voltages to obtain the data of the middle logical page. The first read step from t1 to tB reads the selected memory cells using read voltage VrB, the second read step from tB to tE reads the selected memory cells at read voltage VrE and the third read step from tE to t2 reads the selected memory cells at read voltage VrG.

Subsequently, during the post-read period from t2 to t3, the non-volatile memory may perform various post-read steps to return the memory to a condition in which it is ready to perform a subsequent operation as previously described.

FIG. 9B illustrates an example of an upper page read operation in more detail including voltage on a selected word line throughout the read operation (word line voltage is shown on the vertical axis with time along the horizontal axis). During the pre-read period, voltage on the selected word line is raised to a first voltage Vread and is then lowered to a second (lower) voltage, Vcgr, and allowed to stabilize at Vcgr as discussed with respect to FIG. 7B.

During the read period, the voltage on the selected word line is brought from Vcgr to the first desired read voltage, VrB, and is maintained at VrB throughout a first read step while the selected non-volatile memory cells are sensed at this voltage (e.g., by sense block 500). A read clock, RWL-CLK, is used to time the first read step. Subsequently, in a second read step, the voltage on the selected word line is brought directly from VrB to the second desired read voltage, VrE, and is then maintained at VrE throughout a second read step (time indicated by RWL-CLK) while the selected non-volatile memory cells are sensed at this voltage. Subsequently, in a third read step, the voltage on the selected word line is brought directly from VrE to the third desired read voltage, VrG, and is then maintained at VrG throughout the third read step (time indicated by RWL-CLK).

During the post-read period, the voltage on the selected word line is brought from the read voltage, VrG, to Vread. Post-read steps may be similar to those described with respect to FIG. 7B.

Lower, middle, and upper logical pages may be performed individually in response to individual read commands from a memory controller (e.g., controller 102) to a non-volatile memory die (e.g., memory die 300). In some cases, a controller may initiate reading of all data stored together so that the controller sends a read command directed to a lower page, then a read command directed to a middle page, and then a read command directed to an upper page of the same set of non-volatile memory cells. In response a non-volatile memory die may perform lower, middle, and upper page reads as shown in FIGS. 7A-9B in sequence.

FIG. 10 illustrates an example of three sequential random reads of lower, middle, and upper pages by a non-volatile memory die. Each logical page read operation includes a pre-read period and a post-read period and there may be some time between the end of the post-read of one logical page read (e.g., lower logical page) and the start of the pre-read period of a subsequent logical page read (e.g., middle logical page). For example, it may take some time to receive and decode a command and initiate a logical page read.

In an alternative to the random reads previously described, a non-volatile memory may use a sequential read scheme in which all logical pages that are stored in a group of non-volatile memory cells are read together. An example of such a sequential read scheme is illustrated in FIG. 11, which shows a pre-read period followed by sequential reading at all read voltages (VrA, VrB, VrC, VrD, VrE, VrF, and VrG) in sequence and subsequent post-read period. While the sequential read scheme of FIG. 11 may allow all logical pages of data to be read faster than might be possible using a random read scheme (e.g., faster than the example of FIG. 10), reading at all read voltage levels and subsequently decoding data for multiple logical pages from the results may require significant time and may unnecessarily read and decode data that is not needed. For example, when fewer than all logical pages are required (e.g., two of three logical pages in a non-volatile memory that stores three bits per cell; two or three of four logical pages in a non-volatile memory that stores four bits per cell; two, three, or four logical pages in a non-volatile memory that stores five bits per cell, and so on) reading all logical pages may be slower than performing random reads directed to a smaller number of logical pages (e.g., two random logical page reads may be faster than performing a sequential read of all three logical pages). Thus, the sequential read scheme of FIG. 11 may not be ideal for some scenarios.

In an example of the present technology, a memory controller may specify fewer than all logical pages stored in a group of non-volatile memory cells (e.g., in a physical page of non-volatile memory cells) and a non-volatile memory die may read only the specified logical pages in an efficient manner that may be faster than performing individual random reads for the specified logical pages.

FIG. 12A illustrates an example of a combined read operation that may be implemented in a non-volatile memory system such as non-volatile memory system 100. The combined read operation includes a pre-read step from time t0 to t1 as previously described and performs a lower page read step from time t1 to tD by reading at read voltage VrD. Subsequently, from time tD to t2, the non-volatile memory die performs a middle page read by reading at read voltage VrA from tD to tA, at read voltage VrC from tA to tC, and at read voltage VrF from tC to t2. Subsequently, the non-volatile memory die performs a post-read operation from t2 to t3. Thus, the combined read operation of FIG. 12A combines a lower logical page read and a middle logical page read into a single read operation with no post-read or pre-read steps between logical page reads. Comparing FIG.

12A with FIG. 10, it can be seen that at least one post-read operation and one pre-read operation can be saved as compared with performing two random reads.

FIG. 12B illustrates an example of voltage levels on a selected word line during the combined read illustrated in FIG. 12A. Pre-read operations include increasing word line voltage to Vread and lowering it to Vcgr before reading at VrD (e.g., as shown in FIG. 7B). After reading at VrD is complete (indicated by RWL-CLK), the voltage on the selected word line is lowered to VrA (directly, without going to any voltage higher than VrD or lower than VrA) and then a read is performed at VrA. The voltage is then increased to VrC and then VrF for respective reads as previously discussed with respect to FIG. 8B.

While FIGS. 12A-B illustrate a combined read that combines reading of a lower logical page and a middle logical page, a combined read may include reads of any two or more logical pages of data. For example, a combined lower page read and upper logical page read may include reading at read voltages VrB, VrE, and VrG instead of the middle logical page read voltages (VrA, VrC, and VrF) shown in FIG. 12B. A combined read may also include both middle and upper logical pages by reading at read voltages VrA, VrC, and VrF to read the middle page followed by VrA, VrC, and VrF to read the upper page. In any of these examples, read voltages transition directly from one read voltage to the next without going outside the voltage range of the read voltages. In general, any two or more logical page reads may be combined in a combined read which saves time compared with individual random reads and may save time compared with a sequential read when fewer than all logical pages are needed.

FIGS. 13A-L illustrate an example implementation of a combined read of a lower logical page and middle logical page (e.g., as shown in FIGS. 12A-B) using a set of latches (e.g., data latches 594 of sense block 500). While the present implementation uses three rows of latches (SEN, SDL, and XDL) additional latches may be provided (e.g., ADL, BDL, CDL, and so on) and may be additionally/alternatively used.

FIG. 13A illustrates the data latches after initialization to place rows SDL and SEN in the reset condition (indicated by "1"). Initialization of latches may occur during a pre-read period.

In FIG. 13B, a read is performed at read voltage VrD and the results are stored in row SEN (with data states Er, A, B, C resulting in a logic value 0 and data states D, E, F, and G resulting in a logic value 1 as shown).

In FIG. 13C, the entries in row SEN are combined with corresponding entries in row SDL (all logic value 1) in an Exclusive OR (XOR) operation and the results are stored in SDL.

In FIG. 13D, the contents of row SDL are transferred to row XDL. Data in row XDL is available for transfer so that the data illustrated in FIG. 13D is ready for transfer (e.g., to a memory controller) without performing further read steps. In this way, lower logical page data is rapidly made available to a memory controller and/or host. Rows SEN and SDL are reset (e.g., set to logic value 1 as illustrated).

In FIG. 13E, a read step is performed at read voltage VrA and the results are stored in row SEN (with data state Er resulting in a logic value 0 and all other data states resulting in a logic value 1 as shown).

In FIG. 13F, the entries in row SEN are combined with corresponding entries in row SDL (all logic value 1) as shown in FIG. 13E in an XOR operation and the results are stored in SDL.

In FIG. 13G, row SEN is reset. Read data from read voltage VrA remains in row XDL and XOR data remains in row SDL (rows SDL and XDL are not reset).

In FIG. 13H, a read step is performed at read voltage VrC and the results are stored in row SEN (with data states Er, A, and B resulting in a logic value 0 and data states C, D, E, F, and G resulting in a logic value 1 as shown).

In FIG. 13I, the entries in row SEN are combined with corresponding entries in row SDL as shown in FIG. 13H in an XOR operation and the results are stored in SDL. Row SEN is reset.

In FIG. 13J, a read step is performed at read voltage VrF and the results are stored in row SEN (with data states Er, A, B, C, D, and E resulting in a logic value 0 and data states F and G resulting in a logic value 1 as shown).

In FIG. 13K, the entries in row SEN are combined with corresponding entries in row SDL as shown in FIG. 13J in an XOR operation and the results are stored in row SDL. The contents of row SDL in FIG. 13K represents the XOR product of reading at VrF with the XOR product of reads at VrA, and VrC and this corresponds to a middle page read (e.g., logic values of SDL correspond to logic values of middle row of FIG. 6B).

In FIG. 13L, the entries in row SDL are transferred to row XDL where they are available for transfer. Lower page data that was previously stored in row XDL (e.g., as shown in FIG. 13D) may complete transfer to a memory controller or host during middle logical page read steps (e.g., as shown in FIGS. 13E-13K) so that lower logical page data may be replaced by middle logical page data in row XDL at this point. If row XDL is not free (e.g., transfer of lower page data is still ongoing) then middle page data may be maintained in row SDL until row XDL becomes free (e.g., until all lower page data is transferred). If a further logical page read is to be performed (e.g., an upper page read) then row SEN may be reset, and subsequent read data may be stored in row SEN while middle logical page data is transferred from row XDL.

While the above example refers to combining two logical page reads (lower and middle logical page reads) for a memory structure configured to store three logical pages in a physical page of non-volatile memory cells (three bits per cell), the present technology is applicable to combining any number of logical page reads for memory structures that are configured to store any number of logical pages in a physical page (e.g., storing any number of bits per cell). For example, in a memory structure configured to store four logical pages together in a physical page of non-volatile memory cells, a combined read may combine reading of any two, three, or four logical pages in an efficient manner. In general, aspects of the present technology enable efficient combined reading of from two to n logical pages of n logical pages that are stored together.

When fewer than all logical pages of data stored together are required, aspects of the present technology may provide faster reading than individual random reads (or unnecessarily reading all logical pages in a sequential read). In addition, when all logical pages of data stored together are required, aspects of the present technology may allow data to be more efficiently transferred compared with alternative reading schemes. For example, in the above example, lower page data is available in row XDL for transfer prior to reading middle page data so that transfer of lower page data may occur in parallel with reading middle page data. Such parallel operation may reduce latency when reading any number of logical pages (e.g., as compared with a sequential read that may read at all read voltage levels before transferring any data).

FIGS. 14A-B show an example of a combined read that includes all logical pages stored together in a physical page (in this example, three logical pages in nonvolatile memory cells that store three bits of data per nonvolatile memory cell). Such a combined read may be implemented in a non-volatile memory system such as non-volatile memory system 100.

FIG. 14A shows a pre-read step that extends from time t0 to t1 as previously described and a lower page read step that extends from time t1 to tD including reading at read voltage VrD. Subsequently, from time tD to tF, the non-volatile memory die performs a middle page read by reading at read voltage VrA from tD to tA, at read voltage VrC from tA to tC, and at read voltage VrF from tC to tF. Subsequently, from the non-volatile memory die performs an upper page read by reading at voltage VrB from time tF to tB, at read voltage VrE from tB to tE, and at VrG from tE to t2. Subsequently, the non-volatile memory die performs a post-read operation from t2 to t3 as previously described. Thus, the combined read operation of FIG. 12A combines a lower logical page read, a middle logical page read, and an upper logical page read into a single read operation with no post-read or pre-read steps between logical page reads. Comparing FIG. 14A with FIG. 10, it can be seen that at least two post-read operation and two pre-read operation can be saved as compared with performing three random reads.

FIG. 14B illustrates an example of voltage levels on a selected word line during the combined read illustrated in FIG. 14A. Pre-read operations include increasing word line voltage to Vread and lowering it to Vcgr before reading at VrD (e.g., as shown in FIG. 7B). After reading at VrD is complete (indicated by RWL-CLK), the voltage on the selected word line is lowered to VrA (directly, without going to any voltage higher than VrD or lower than VrA) and then a read is performed at VrA. The word line voltage is then increased to VrC and then VrF for respective reads as previously discussed with respect to FIG. 8B. The word line voltage is then lowered to VrB and a read is performed at VrB, the word line voltage is then increased to VrE and a read is performed at VrE, and then to VrG and another read is performed at VrG. Thus, lower, middle, and upper pages are read in a combined read operation without pre-read or post-read steps between reads of different logical pages. This can enable transfer of lower logical page data while a middle and/or upper page read is performed (e.g., from time tD to time tF and/or tF to t2) and enable transfer of middle logical page data while an upper page read is performed (e.g., from time tF to t2).

FIG. 15 illustrates an example of reading and transfer of data of multiple logical pages that are read in a combined read (e.g., combined read of three logical pages illustrated in FIGS. 14A-B using latches SDL and XDL as illustrated in FIGS. 13A-13L). Generally, time extends horizontally from left to right with read-related steps on the lower part and readout-related steps along the upper part of the drawing.

When the read starts 1502 (e.g., when a read command is received), the lower page is read to SDL 1504 (e.g., initially read to SEN and transferred to SDL) and then an SDL to XDL transfer 1506 occurs to place lower page data in XDL so that it can be read out. An SDL reset 1508 then occurs and a middle page read to SDL 1510 occurs, followed by an SDL to temporary latch transfer 1512. Lower page readout 1516 transfers lower page data from XDL to interface circuits and/or off-chip circuits such as a memory controller. This may occur in parallel with one or more of steps 1508, 1510, 1512. An XDL reset 1518 occurs after lower page readout 1516 to allow new data to be placed in the XDL. Temporary data transferred to the temporary latch at step 1512 (middle page data) is transferred to XDL 1520 (if XDL is available when middle page data is read to SDL at step 1510 then the middle page data may be directly transferred from SDL to XDL instead of through a temporary latch). The middle page data is readout 1522 from XDL (e.g., to interface circuits and/or off-chip circuits such as memory controller) and then an XDL reset 1524 occurs to allow new data to be transferred to XDL. After SDL to temporary latch transfer 1512 (and, in some cases, in parallel with one or more of steps 1520, 1522, 1524), an SDL reset occurs 1526, followed by an upper page read to SDL 1528 and an SDL to XDL transfer 1530 to place upper page data in XDL (previously reset at step 1524). Upper page readout 1532 from XDL then transfers upper page data (e.g., to interface circuits and/or off-chip circuits such as memory controller) and the read operation ends 1534.

A combined read operation (e.g., as described in any of the previous examples) may be initiated by a command received by a non-volatile memory die. A host or memory controller (e.g., host 120 or controller 102) may send such a command to a memory die (e.g., memory die 300 over lines 318 of memory bus 294). In some examples, a dedicated command may be used for such a combined read operation in addition to, or instead of, other read commands such as individual random read commands and/or sequential read commands.

Table 1 illustrates an example of bits of a combined read command for a non-volatile memory that stores four logical pages of data per physical page of non-volatile memory cells: Lower Page (LP), Middle Page (MP), Upper page (UP) and Top Page (TP). Each bit can have a value of 1 to indicate that a corresponding logical page should be read or a value of 0 to indicate that a corresponding logical page should not be read. If bit 1 has a bit value 1 then the lower page should be read (Read LP) and if it has a bit value 0 then the lower page should not be read (No LP read). If bit 2 has a bit value 1 then the middle page should be read (Read MP) and if it has a bit value 0 then the middle page should not be read (No MP read). If bit 3 has a bit value 1 then the Upper page should be read (Read UP) and if it has a bit value 0 then the upper page should not be read (No UP read). If bit 4 has a bit value 1 then the top page should be read (Read TP) and if it has a bit value 0 then the top page should not be read (No TP read).

TABLE 1

| Bit position | Bit value | Meaning |
|---|---|---|
| 1 | 1/0 | 1-Read LP, 0-No LP read |
| 2 | 1/0 | 1-Read MP, 0-No MP read |
| 3 | 1/0 | 1-Read UP, 0-No UP read |
| 4 | 1/0 | 1-Read TP, 0-No TP read |

It can be seen that any combination of logical pages may be specified for a combined read using such a combined read command. This may be more efficient than sending separate individual random read commands for multiple logical pages (e.g., less traffic on a bus between a controller and a memory die) while allowing fewer than all logical pages in a physical page to be read. A combined read command may include a number of such bits corresponding to the number of logical pages in a physical page of memory, e.g., a combined read command may have n bits (e.g., an n-bit string) corresponding to n logical pages. A combined read command may include a physical address of a particular physical page of non-volatile memory cells and may include bits (e.g., as illustrated in table 1) to further indicate which logical pages are to be read. Control circuits on a memory die (e.g., control circuits 310) may be configured to receive such a command, parse the command to identify the command as a combined read command, identify the physical address of the non-volatile memory cells to be read, and identify which specific logical pages to read in the combined read operation. Control circuits 310 may be considered an example of means for receiving a combined read command over a bus, the combined read command specifying a subset of three or more logical pages stored together, the subset consisting of two or more selected logical pages that is fewer than all of the three or more logical pages, identifying the subset of the three or more logical pages, reading a first selected logical page from the plurality of non-volatile memory cells, and reading a second selected logical page from the plurality of non-volatile memory cells while transferring the first selected logical page over the bus. Data latches (e.g., data latches 594, which may be implemented as illustrated in FIGS. 13A-L) may be connected to control circuits and may be considered a means for storing at least the first selected logical page while transferring the first selected logical page over the bus, data of the second selected logical page while reading the second selected logical page, and one or more additional logical pages.

While the above examples show combining reading of two or more logical pages, each logical page including reading at one or more read voltage, aspects of the present technology may also be applied in other cases. For example, in some cases, multiple reads are performed for the same data state with different read voltages over a relatively small range (smaller than the difference between read voltages for different data states) in what may be referred to as a read scan. Read voltages may be optimized by using a read scan to find a read voltage that results in a low error rate. Multiple read steps directed to the same data state (or states) may be included in a combined read. Data from each read step may be stored in a corresponding row of latches and may be transferred out as appropriate (e.g., as row XDL becomes available). Thus, instead of reads at VrD, VrA, VrC, and VrF to read lower and middle logical pages (e.g., as shown in FIGS. 12A-B) a read scan may include multiple reads close to a nominal VrD (e.g., VrD-2δ, VrD-δ, VrD, VrD+δ, VrD+2δ) and/or other nominal read voltages for other data states. A corresponding command may be received by a memory die (e.g., from a controller) to indicate what read voltages to use in a combined read scan.

FIG. 16 illustrates an example of a method that may be implemented using one or more components described above (e.g., controller 102, memory die 300, sense block 500). The method includes selecting a subset of a plurality of logical pages stored in a plurality of non-volatile memory cells for reading, the subset consisting of two or more selected logical pages that are fewer than all of the plurality of logical pages 1650, preparing the plurality of non-volatile memory cells for reading including raising voltage on a corresponding word line to a first voltage and lowering the voltage on the word line to a second voltage 1652, and reading the subset of the plurality of logical pages in a combined read during which the voltage on the corresponding word line remains lower than the first voltage and higher than the second voltage 1654.

An example of an apparatus includes one or more control circuits configured to connect to a plurality of non-volatile memory cells, each non-volatile memory cell configured to store a plurality of bits of a plurality of logical pages including at least a first bit of a first logical page, a second bit of a second logical page and a third bit of a third logical page, the one or more control circuits configured to select a subset of the plurality of logical pages for reading, the subset consisting of two or more selected logical pages that are fewer than all of the plurality of logical pages, perform pre-read steps, read a first selected logical page of the subset and at least a second selected logical page of the subset without performing pre-read steps between reading the first and second selected logical pages.

The pre-read steps may include raising a voltage on a word line connected to the plurality of non-volatile memory cells to a first voltage that is higher than read voltages for the selected logical pages and lowering the voltage on the word line to a second voltage that is lower than the read voltages for the selected logical pages. The one or more control circuits may be further configured to read all of the selected logical pages without raising the voltage on the word line to the first voltage or lowering the voltage on the word line to the second voltage. The one or more control circuits may be further configured to perform post-read steps after reading all of the selected logical pages. The one or more control circuits may be configured to omit post-read steps between reading selected logical pages. The post-read steps may include raising a voltage on a word line connected to the plurality of non-volatile memory cells to a first voltage that is higher than read voltages for the selected logical pages. The one or more control circuits may be further configured to place data from reading the first selected logical page in a first set of data latches for transfer during reading of the second selected logical page into a second set of data latches. The plurality of logical pages may consist of three logical pages and the subset consists of two and only two selected logical pages. The plurality of logical pages may consist of the first logical page, the second logical page, and the third logical page, the one or more control circuits may be further configured to use a single read voltage to read the first selected logical page and use three read voltages to read the second selected logical page. The one or more control circuits may be further configured to combine results obtained using the three read voltages by one or more Exclusive OR (XOR) operations to obtain data of the second selected logical page. The plurality of logical pages may consist of four logical pages and the subset may consist of either two selected logical pages or three selected logical pages. The one or more control circuits may be further configured to parse a combined read command and determine from a first bit of the combined read command whether to read the first logical page, determine from a second bit of the combined read command whether to read the second logical page, and determine from a third bit of the combined read command whether to read the third logical page.

An example of a method includes selecting a subset of a plurality of logical pages stored in a plurality of non-volatile memory cells for reading, the subset consisting of two or more selected logical pages that are fewer than all of the plurality of logical pages; preparing the plurality of non-volatile memory cells for reading including raising voltage on a corresponding word line to a first voltage and lowering the voltage on the corresponding word line to a second voltage; and reading the subset of the plurality of logical pages in a combined read during which the voltage on the corresponding word line remains lower than the first voltage and higher than the second voltage.

The method may further include receiving a combined read command identifying the two or more selected logical pages, the combined read command including a string of n-bits corresponding to n logical pages, each bit signifying whether a corresponding logical page is selected for the combined read, at least two bits indicating logical pages to be read and at least one bit indicating a logical page not to be read. The time to execute the combined read command may be less than the time to individually execute individual read commands directed to the two or more selected logical pages. Reading the subset of the plurality of logical pages in the combined read may include reading a first selected logical page, storing data from the first selected logical page in a first set of data latches and, while the data from the first selected logical page is in the first set of data latches, initiating reading a second selected logical page. The plurality of logical pages may consist of three logical pages and the subset of the plurality of logical pages may consist of two selected logical pages. The plurality of logical pages may consist of n logical pages and the subset of the plurality of logical pages may consist of from 2 to n−1 logical pages.

An example of a data storage system includes a plurality of non-volatile memory cells configured to store three or more logical pages of data, each non-volatile memory cell configured to store a bit from each of the three or more logical pages; and means for receiving a combined read command over a bus, the combined read command specifying a subset of the three or more logical pages, the subset consisting of two or more selected logical pages that is fewer than all of the three or more logical pages, identifying the subset of the three or more logical pages, reading a first selected logical page from the plurality of non-volatile memory cells, and reading a second selected logical page from the plurality of non-volatile memory cells while transferring the first selected logical page over the bus.

The data storage system may further include means for storing at least the first selected logical page while transferring the first selected logical page over the bus, data of the second selected logical page while reading the second selected logical page, and one or more additional logical pages.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   one or more control circuits configured to connect to a plurality of non-volatile memory cells, each non-volatile memory cell configured to store a plurality of bits of a plurality of logical pages including at least a first bit of a first logical page, a second bit of a second logical page and a third bit of a third logical page,
   the one or more control circuits are configured to:
      select a subset of the plurality of logical pages for reading, the subset consisting of two or more selected logical pages that are fewer than all of the plurality of logical pages,
      perform pre-read steps, and
      read a first selected logical page of the subset and at least a second selected logical page of the subset without performing pre-read steps between reading the first and second selected logical pages.

2. The apparatus of claim 1, wherein pre-read steps include the one or more control circuits raising a voltage on a word line connected to the plurality of non-volatile memory cells to a first voltage that is higher than read voltages for the selected logical pages and lowering the voltage on the word line to a second voltage that is lower than the read voltages for the selected logical pages.

3. The apparatus of claim 2, wherein the one or more control circuits are further configured to read all of the selected logical pages without raising the voltage on the word line to the first voltage or lowering the voltage on the word line to the second voltage.

4. The apparatus of claim 3, wherein the one or more control circuits are further configured to perform post-read steps after reading all of the selected logical pages.

5. The apparatus of claim 4, wherein the one or more control circuits are configured to omit post-read steps between reading selected logical pages.

6. The apparatus of claim 5, wherein the post-read steps include the one or more control circuits raising a voltage on a word line connected to the plurality of non-volatile memory cells to a first voltage that is higher than read voltages for the selected logical pages.

7. The apparatus of claim 1, wherein the one or more control circuits are further configured to place data from reading the first selected logical page in a first set of data latches for transfer during reading of the second selected logical page into a second set of data latches.

8. The apparatus of claim 1, wherein the plurality of logical pages consists of three logical pages and the subset consists of two and only two selected logical pages.

9. The apparatus of claim 8, wherein the plurality of logical pages consists of the first logical page, the second logical page, and the third logical page, the one or more control circuits are further configured to use a single read voltage to read the first selected logical page and use three read voltages to read the second selected logical page.

10. The apparatus of claim 9, wherein the one or more control circuits are further configured to combine results obtained using the three read voltages by one or more Exclusive OR (XOR) operations to obtain data of the second selected logical page.

11. The apparatus of claim 1, wherein the plurality of logical pages consists of four logical pages and the subset consists of either two selected logical pages or three selected logical pages.

12. The apparatus of claim 1, wherein the one or more control circuits are further configured to parse a combined read command and determine from a first bit of the combined read command whether to read the first logical page, determine from a second bit of the combined read command whether to read the second logical page, and determine from a third bit of the combined read command whether to read the third logical page.

13. A method comprising:
selecting a subset of a plurality of logical pages stored in a plurality of non-volatile memory cells for reading, the subset consisting of two or more selected logical pages that are fewer than all of the plurality of logical pages;
preparing the plurality of non-volatile memory cells for reading including raising voltage on a corresponding word line to a first voltage and lowering the voltage on the corresponding word line to a second voltage; and
reading the subset of the plurality of logical pages in a combined read during which the voltage on the corresponding word line remains lower than the first voltage and higher than the second voltage, the combined read includes reading a first selected logical page, storing data from the first selected logical page in a first set of data latches and, while the data from the first selected logical page is in the first set of data latches, initiating reading a second selected logical page.

14. The method of claim 13 further comprising receiving a combined read command identifying the two or more selected logical pages, the combined read command including a string of n-bits corresponding to n logical pages, each bit signifying whether a corresponding logical page is selected for the combined read, at least two bits indicating logical pages to be read and at least one bit indicating a logical page not to be read.

15. The method of claim 14 wherein the time to execute the combined read command is less than the time to individually execute individual read commands directed to the two or more selected logical pages.

16. The method of claim 13, wherein the plurality of logical pages consists of four logical pages and the subset of the plurality of logical pages consists of two selected logical pages or three selected logical pages.

17. The method of claim 13 wherein the plurality of logical pages consists of three logical pages and the subset of the plurality of logical pages consists of two selected logical pages.

18. The method of claim 13 wherein the plurality of logical pages consists of n logical pages and the subset of the plurality of logical pages consists of from 2 to n−1 logical pages.

19. A data storage system comprising:
a plurality of non-volatile memory cells configured to store three or more logical pages of data, each non-volatile memory cell configured to store a bit from each of the three or more logical pages; and
means for receiving a combined read command over a bus, the combined read command specifying a subset of the three or more logical pages, the subset consisting of two or more selected logical pages that is fewer than all of the three or more logical pages, identifying the subset of the three or more logical pages, reading a first selected logical page from the plurality of non-volatile memory cells, and reading a second selected logical page from the plurality of non-volatile memory cells while transferring the first selected logical page over the bus.

20. The data storage system of claim 19, further comprising means for storing at least the first selected logical page while transferring the first selected logical page over the bus, data of the second selected logical page while reading the second selected logical page, and one or more additional logical pages.

* * * * *